United States Patent
Pellizzer

(10) Patent No.: US 9,343,506 B2
(45) Date of Patent: May 17, 2016

(54) MEMORY ARRAYS WITH POLYGONAL MEMORY CELLS HAVING SPECIFIC SIDEWALL ORIENTATIONS

(71) Applicant: Micron Technology, Inc., Boise, ID (US)

(72) Inventor: Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/295,770

(22) Filed: Jun. 4, 2014

(65) Prior Publication Data
US 2015/0357380 A1 Dec. 10, 2015

(51) Int. Cl.
*H01L 27/24* (2006.01)
*H01L 45/00* (2006.01)

(52) U.S. Cl.
CPC ............ *H01L 27/2463* (2013.01); *H01L 45/06* (2013.01); *H01L 45/1233* (2013.01); *H01L 45/144* (2013.01); *H01L 45/1666* (2013.01)

(58) Field of Classification Search
CPC .............. H01L 27/249; H01L 45/1675; H01L 45/1253; H01L 45/085; H01L 45/143; H01L 27/2436; H01L 45/08; H01L 45/144; H01L 45/147; H01L 45/14; H01L 45/04; H01L 45/146; H01L 45/1226; H01L 45/142; G11C 13/0002; G11C 13/0011
USPC ............ 257/208, E23.141, E21.645; 438/128
See application file for complete search history.

(56) References Cited

U.S. PATENT DOCUMENTS

| | | | |
|---|---|---|---|
| 4,752,118 A | 6/1988 | Johnson | |
| 4,849,247 A | 7/1989 | Scanlon et al. | |
| 4,987,099 A | 1/1991 | Flanner | |
| 5,055,423 A | 10/1991 | Smith et al. | |
| 5,166,758 A | 11/1992 | Ovshinsky et al. | |
| 5,341,326 A | 8/1994 | Takase et al. | |

(Continued)

FOREIGN PATENT DOCUMENTS

| | | |
|---|---|---|
| EP | 12850697.9 | 6/2015 |
| WO | WO 2005/041196 | 5/2005 |

(Continued)

OTHER PUBLICATIONS

U.S. Appl. No. 14/242,588, filed Apr. 1, 2014, Lindenberg.

(Continued)

*Primary Examiner* — Evan Pert
*Assistant Examiner* — Changhyun Yi
(74) *Attorney, Agent, or Firm* — Wells St. John P.S.

(57) ABSTRACT

Some embodiments include a memory array having a first series of access/sense lines which extend along a first direction, a second series of access/sense lines over the first series of access/sense lines and which extend along a second direction substantially orthogonal to the first direction, and memory cells vertically between the first and second series of access/sense lines. Each memory cell is uniquely addressed by a combination of an access/sense line from the first series and an access/sense line from the second series. The memory cells have programmable material. At least some of the programmable material within each memory cell is a polygonal structure having a sidewall that extends along a third direction which is different from the first and second directions. Some embodiments include methods of forming memory arrays.

15 Claims, 48 Drawing Sheets

(56) References Cited

U.S. PATENT DOCUMENTS

| | | |
|---|---|---|
| 5,895,963 A | 4/1999 | Yamazaki |
| 5,912,839 A | 6/1999 | Ovshinsky et al. |
| 6,143,670 A | 11/2000 | Cheng et al. |
| 6,611,453 B2 | 8/2003 | Ning |
| 6,613,604 B2 | 9/2003 | Maimon et al. |
| 6,661,330 B1 | 12/2003 | Young |
| 6,664,182 B2 | 12/2003 | Jeng |
| 6,692,898 B2 | 2/2004 | Ning |
| 6,700,211 B2 | 3/2004 | Gonzalez |
| 6,764,894 B2 | 7/2004 | Lowrey |
| 7,148,140 B2 | 12/2006 | Leavy et al. |
| 7,169,624 B2 | 1/2007 | Hsu |
| 7,332,401 B2 | 2/2008 | Moore et al. |
| 7,422,926 B2 | 9/2008 | Pellizzer et al. |
| 7,453,111 B2 | 11/2008 | Ryoo et al. |
| 7,619,933 B2 | 11/2009 | Sarin |
| 7,638,787 B2 | 12/2009 | An et al. |
| 7,646,631 B2 | 1/2010 | Lung |
| 7,719,039 B2 | 5/2010 | Muralidhar et al. |
| 7,772,680 B2 | 8/2010 | Manning |
| 7,773,413 B2 | 8/2010 | Shalvi |
| 7,785,978 B2 | 8/2010 | Smythe |
| 7,800,092 B2 | 9/2010 | Liu et al. |
| 7,803,655 B2 | 9/2010 | Johnson et al. |
| 7,838,341 B2 | 11/2010 | Dennison |
| 7,867,832 B2 | 1/2011 | Yang et al. |
| 7,888,711 B2 | 2/2011 | Cheung et al. |
| 7,915,602 B2 | 3/2011 | Sato |
| 7,919,766 B2 | 4/2011 | Lung |
| 7,935,553 B2 | 5/2011 | Scheuerlein et al. |
| 7,974,115 B2 | 7/2011 | Jeong et al. |
| 8,013,319 B2 | 9/2011 | Chang |
| 8,110,822 B2 | 2/2012 | Chen |
| 8,486,743 B2 | 7/2013 | Bresolin et al. |
| 8,507,353 B2 | 8/2013 | Oh et al. |
| 8,546,231 B2 | 10/2013 | Pellizzer et al. |
| 8,614,433 B2 | 12/2013 | Lee et al. |
| 8,723,155 B2 | 5/2014 | Redaelli et al. |
| 8,765,555 B2 | 7/2014 | Van Gerpen |
| 8,822,969 B2 | 9/2014 | Hwang |
| 2002/0017701 A1 | 2/2002 | Klersy et al. |
| 2002/0173101 A1 | 11/2002 | Shau |
| 2002/0177292 A1 | 11/2002 | Dennison |
| 2004/0178425 A1 | 9/2004 | Kato |
| 2004/0188668 A1 | 9/2004 | Hamann et al. |
| 2005/0006681 A1 | 1/2005 | Okuno |
| 2005/0110983 A1 | 5/2005 | Jeong et al. |
| 2005/0117397 A1 | 6/2005 | Morimoto |
| 2006/0073652 A1 | 4/2006 | Pellizzer et al. |
| 2006/0076548 A1 | 4/2006 | Park et al. |
| 2006/0113520 A1 | 6/2006 | Yamamoto et al. |
| 2006/0157682 A1 | 7/2006 | Scheurlein |
| 2006/0186440 A1 | 8/2006 | Wang et al. |
| 2006/0284279 A1 | 12/2006 | Lung et al. |
| 2006/0286709 A1 | 12/2006 | Lung et al. |
| 2007/0008773 A1 | 1/2007 | Scheuerlein |
| 2007/0012905 A1 | 1/2007 | Huang |
| 2007/0029676 A1 | 2/2007 | Takaura et al. |
| 2007/0054486 A1 | 3/2007 | Yang |
| 2007/0075347 A1 | 4/2007 | Lai et al. |
| 2007/0075359 A1 | 4/2007 | Yoon et al. |
| 2007/0108431 A1 | 5/2007 | Chen et al. |
| 2007/0158698 A1 | 7/2007 | Dennison et al. |
| 2007/0224726 A1 | 9/2007 | Chen et al. |
| 2007/0235708 A1 | 10/2007 | Elmegreen et al. |
| 2007/0279974 A1 | 12/2007 | Dennison et al. |
| 2008/0043520 A1 | 2/2008 | Chen |
| 2008/0054470 A1 | 3/2008 | Amano et al. |
| 2008/0067485 A1 | 3/2008 | Besana et al. |
| 2008/0067486 A1 | 3/2008 | Karpov et al. |
| 2008/0093703 A1 | 4/2008 | Yang et al. |
| 2008/0101109 A1 | 5/2008 | Haring-Bolivar et al. |
| 2008/0105862 A1 | 5/2008 | Lung et al. |
| 2008/0123394 A1 | 5/2008 | Lee et al. |
| 2008/0128677 A1 | 6/2008 | Park et al. |
| 2008/0137400 A1 | 6/2008 | Chen et al. |
| 2008/0138929 A1 | 6/2008 | Lung |
| 2008/0157053 A1 | 7/2008 | Lai et al. |
| 2008/0197394 A1 | 8/2008 | Caspary et al. |
| 2009/0008621 A1 | 1/2009 | Lin et al. |
| 2009/0017577 A1 | 1/2009 | An et al. |
| 2009/0032794 A1 | 2/2009 | Hsiao |
| 2009/0039333 A1 | 2/2009 | Chang et al. |
| 2009/0072213 A1 | 3/2009 | Elmegreen et al. |
| 2009/0072341 A1 | 3/2009 | Liu et al. |
| 2009/0091971 A1 | 4/2009 | Dennison et al. |
| 2009/0101883 A1 | 4/2009 | Lai et al. |
| 2009/0108247 A1 | 4/2009 | Takaura et al. |
| 2009/0115020 A1 | 5/2009 | Yang et al. |
| 2009/0127538 A1 | 5/2009 | Ryoo et al. |
| 2009/0147564 A1 | 6/2009 | Lung |
| 2009/0166601 A1 | 7/2009 | Czubatyj et al. |
| 2009/0194757 A1 | 8/2009 | Lam et al. |
| 2009/0194758 A1 | 8/2009 | Chen |
| 2009/0230505 A1 | 9/2009 | Dennison |
| 2009/0298222 A1 | 12/2009 | Lowrey et al. |
| 2009/0302300 A1 | 12/2009 | Chang |
| 2009/0321706 A1 | 12/2009 | Happ et al. |
| 2010/0001248 A1 | 1/2010 | Wouters et al. |
| 2010/0001253 A1 | 1/2010 | Arnold et al. |
| 2010/0019221 A1 | 1/2010 | Lung et al. |
| 2010/0054029 A1 | 3/2010 | Happ et al. |
| 2010/0055830 A1 | 3/2010 | Chen et al. |
| 2010/0065530 A1 | 3/2010 | Walker et al. |
| 2010/0072447 A1 | 3/2010 | Lung |
| 2010/0072453 A1 | 3/2010 | Jeong et al. |
| 2010/0107403 A1 | 5/2010 | Aubel et al. |
| 2010/0151652 A1 | 6/2010 | Lung et al. |
| 2010/0163830 A1 | 7/2010 | Chang et al. |
| 2010/0163833 A1 | 7/2010 | Borghi et al. |
| 2010/0165719 A1 | 7/2010 | Pellizzer |
| 2010/0176368 A1 | 7/2010 | Ko et al. |
| 2010/0176911 A1 | 7/2010 | Park et al. |
| 2010/0207168 A1 | 8/2010 | Sills et al. |
| 2010/0213431 A1 | 8/2010 | Yeh et al. |
| 2010/0221874 A1 | 9/2010 | Kuo et al. |
| 2010/0270529 A1 | 10/2010 | Lung |
| 2010/0301303 A1 | 12/2010 | Wang et al. |
| 2010/0301304 A1 | 12/2010 | Chen et al. |
| 2010/0301417 A1 | 12/2010 | Cheng et al. |
| 2010/0308296 A1 | 12/2010 | Pirovano et al. |
| 2010/0323490 A1 | 12/2010 | Sreenivasan et al. |
| 2010/0327251 A1 | 12/2010 | Park |
| 2011/0001114 A1 | 1/2011 | Zanderighi et al. |
| 2011/0031461 A1 | 2/2011 | Kang et al. |
| 2011/0068318 A1 | 3/2011 | Ishibashi et al. |
| 2011/0074538 A1 | 3/2011 | Wu et al. |
| 2011/0092041 A1 | 4/2011 | Lai et al. |
| 2011/0155984 A1 | 6/2011 | Redaelli et al. |
| 2011/0193049 A1 | 8/2011 | Iwakaji et al. |
| 2011/0215436 A1 | 9/2011 | Tang et al. |
| 2011/0284815 A1 | 11/2011 | Kim et al. |
| 2011/0300685 A1 | 12/2011 | Horii et al. |
| 2011/0312178 A1 | 12/2011 | Watanabe et al. |
| 2012/0241705 A1 | 9/2012 | Bresolin et al. |
| 2012/0256150 A1* | 10/2012 | Zagrebelny et al. ............... 257/2 |
| 2012/0256151 A1* | 10/2012 | Liu et al. ............................ 257/2 |
| 2012/0273742 A1 | 11/2012 | Minemura |
| 2013/0099888 A1 | 4/2013 | Redaelli et al. |
| 2013/0126816 A1 | 5/2013 | Tang et al. |
| 2013/0126822 A1* | 5/2013 | Pellizzer et al. ................... 257/5 |
| 2013/0277796 A1 | 10/2013 | Yang et al. |
| 2013/0285002 A1 | 10/2013 | Van Gerpen et al. |
| 2014/0117302 A1 | 5/2014 | Goswami |
| 2014/0217350 A1 | 8/2014 | Liu et al. |

FOREIGN PATENT DOCUMENTS

| | | |
|---|---|---|
| WO | WO 2010/073904 | 7/2010 |
| WO | WO 2013/039496 | 3/2013 |
| WO | WO PCT/US2012/063962 | 3/2013 |

(56) References Cited

FOREIGN PATENT DOCUMENTS

| | | |
|---|---|---|
| WO | WO PCT/US2012/063962 | 5/2014 |
| WO | WO PCT/US2014/011250 | 5/2014 |
| WO | WO PCT/US2014/011250 | 8/2015 |

OTHER PUBLICATIONS

U.S. Appl. No. 14/293,577, filed Jun. 2, 2014, Pellizzer et al.

Bez; Chalcogenide PCM: a Memory Technology for Next Decade; IEEE, 2009, pp. 5.1.1 .5.1.4.

Czubatyj et al., "Current Reduction in Ovonic Memory Devices", downloaded from www.epcos.org/library/papers/pdC2006/pdf.../Czubatyj.pdf; prior to Nov. 17, 2011.

Fazio, "Future Directions of Non-Volatile Memory in Compute Applications", IEEE, 2009, pp. 27.7.1-7 27,7.4.

Happ et al., "Novel One-Mask Self-Heating Pillar Phase Change Memory", IEEE, 2006 Symposium on 5 VLSI Technology Digest of Technical Papers; 2 pp.

Lee et al.; Programming Disturbance and Cell Scaling in Phase Change Memory: For up to 16nm based 4F2 Cell; IEEE, 2010 Symposium on VLSI Technology Digest ofTechnical Papers, pp. 199-200.

Raoux et al., Effect of Ion Implantation on Crystallization Properties of Phase Change Materials, presented at E\PCOS201 0 Conference, Sep. 6-7, 2010, Politecnico di Milano, Milan, Italy.

Russo et al.; Modeling of Programming and Read Performance in Phase-Change Memories—Part II: Program Disturb and Mixed-Scaling Approach,. IEEE Transactions on Electron Devices, vol. 55(2), Feb. 2008, pp. 5.15-5.22.

Servalli; A 45nm Generation Phase Change Memory Technology; IEEE 2009; pp. IEDM09-113-116.

Villa et al.; A 45nm 1Gb 1.8V Phase-Change Memory; 2010 IEEE International Solid-State Circuits Conference; Feb. 9, 2010; pp. 270-271.

* cited by examiner

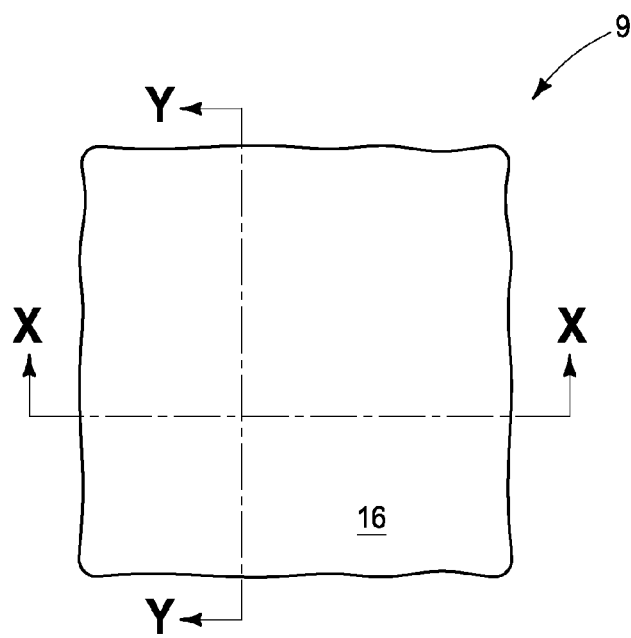
FIG. 1
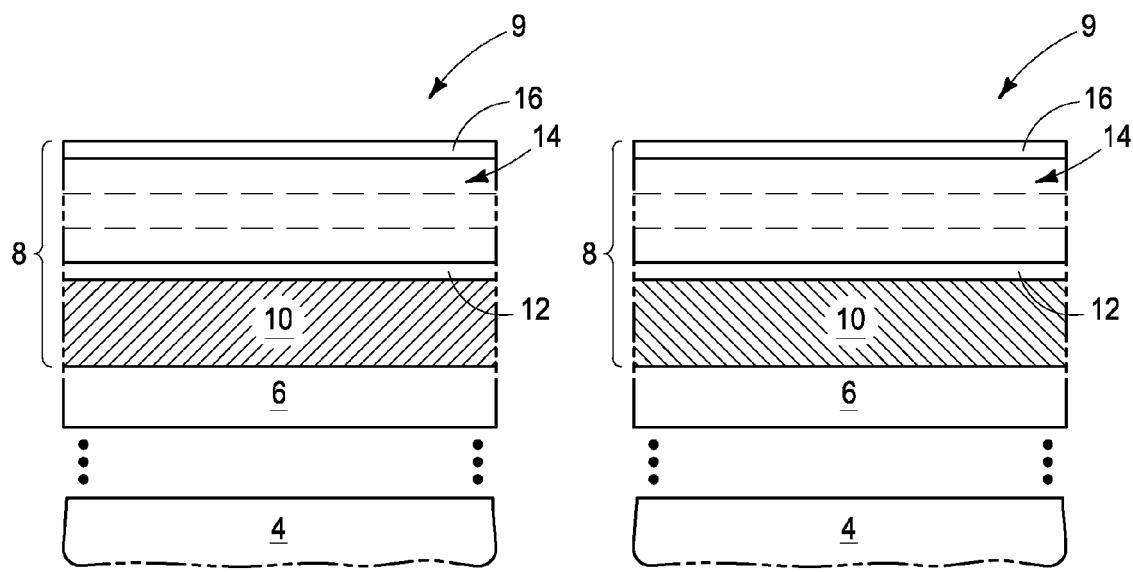
X-X
FIG. 1A
Y-Y
FIG. 1B

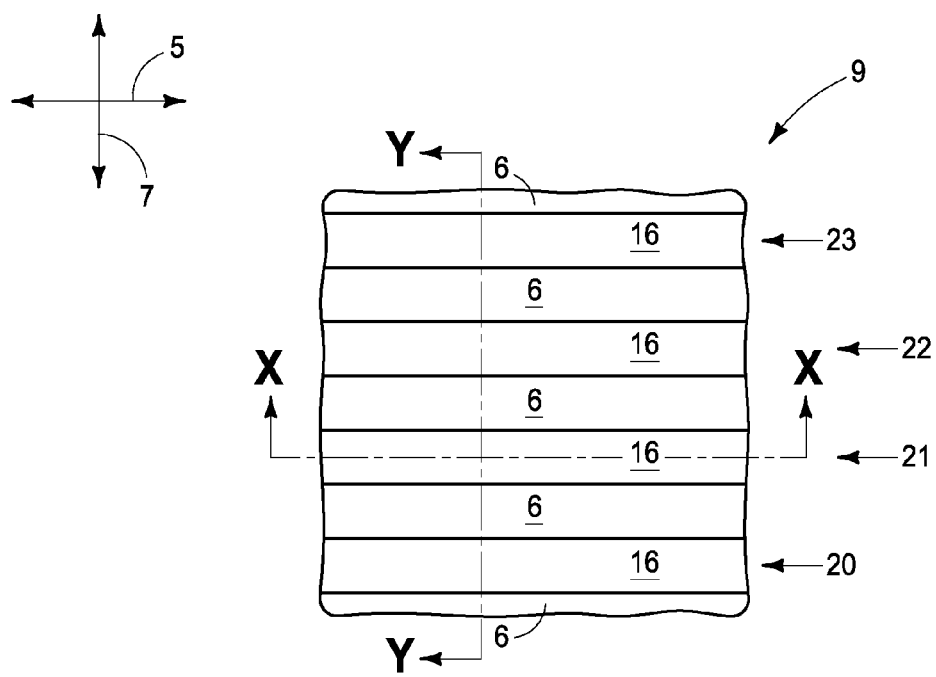
FIG. 2
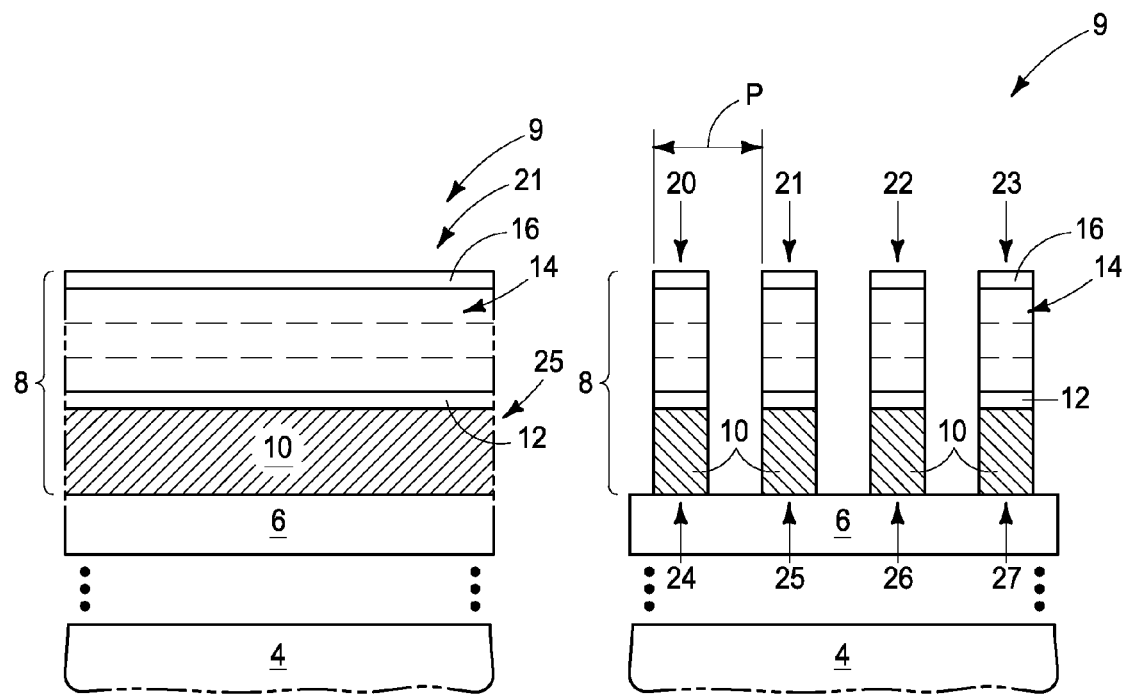
X-X
FIG. 2A
Y-Y
FIG. 2B

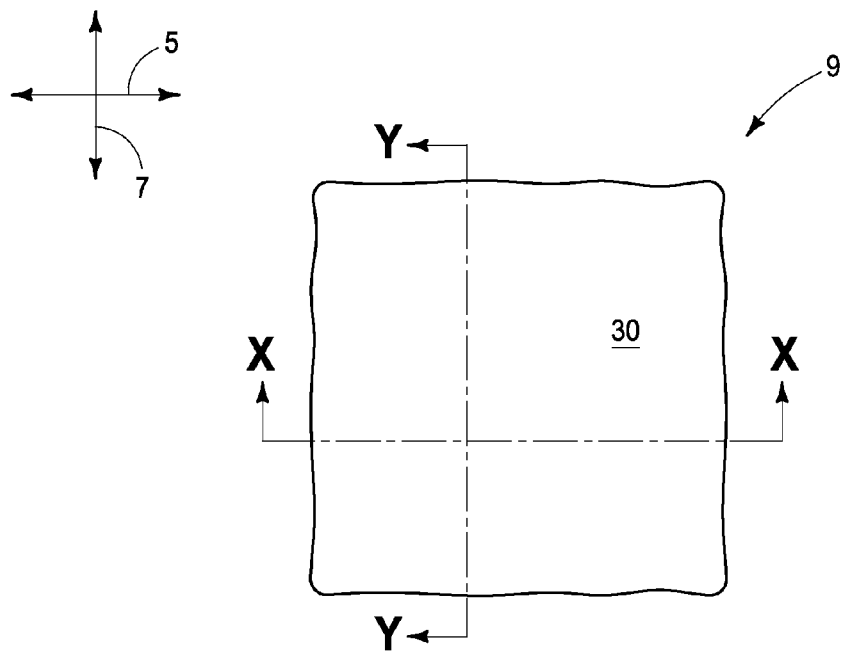
FIG. 3
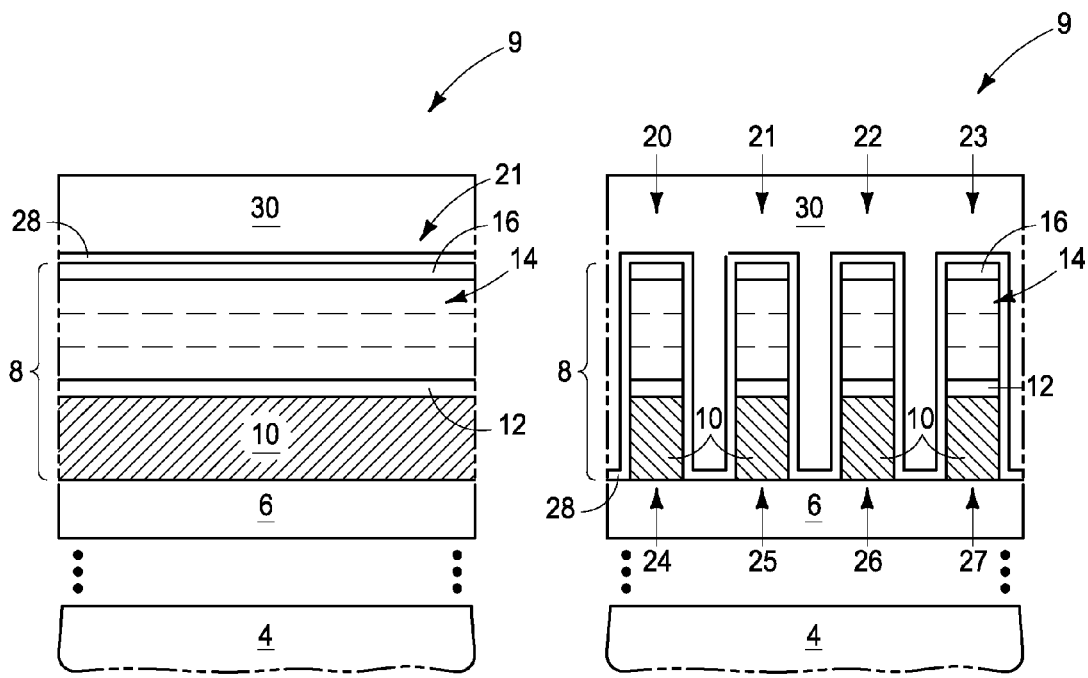
X-X
FIG. 3A
Y-Y
FIG. 3B

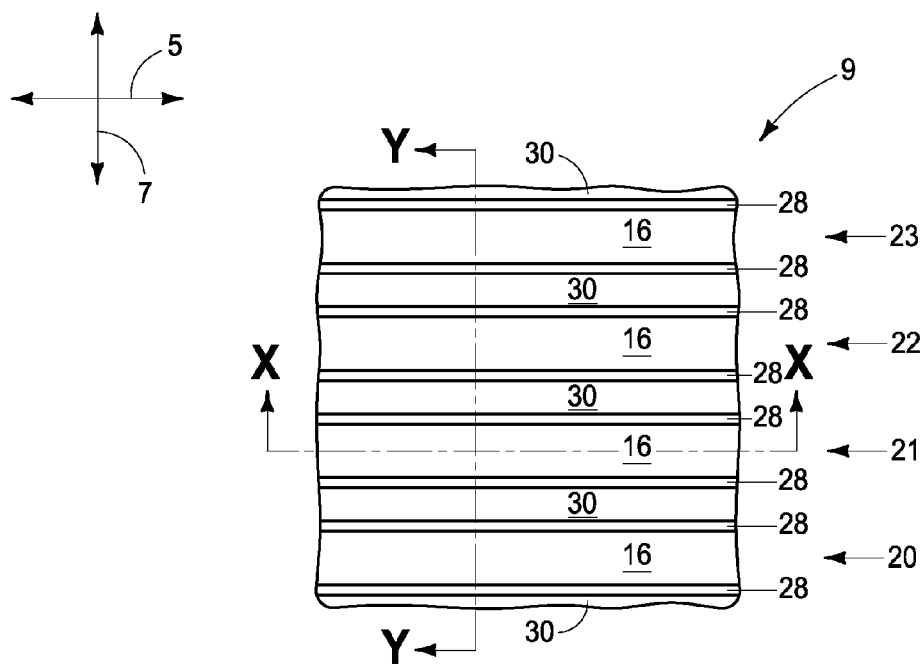
FIG. 4
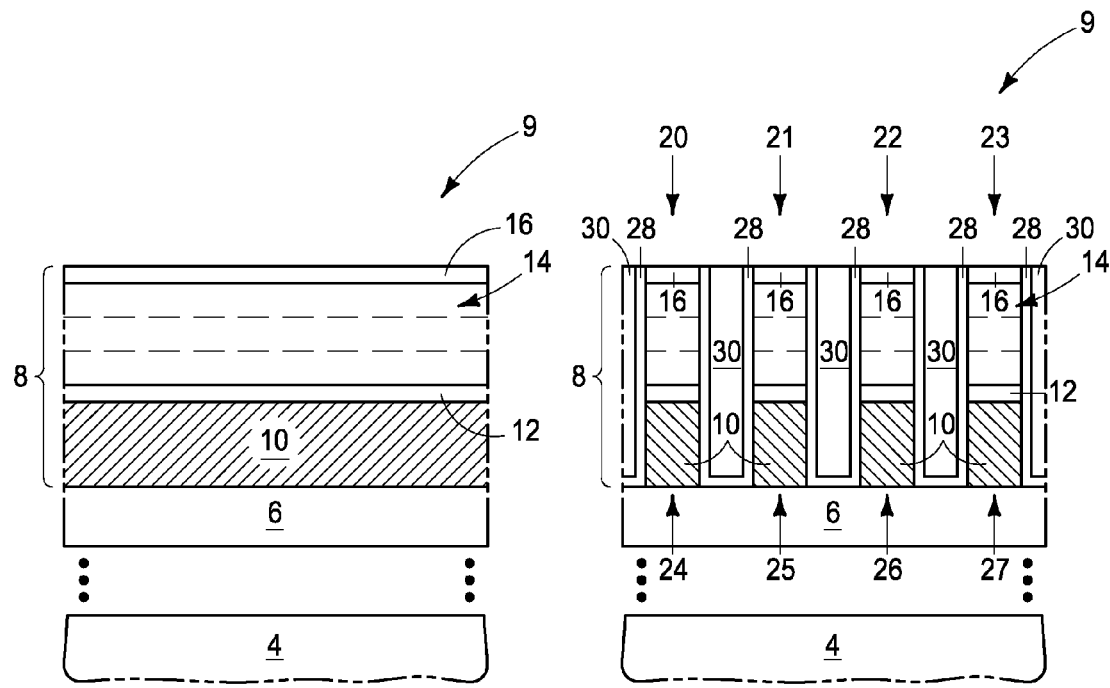
X-X
FIG. 4A
Y-Y
FIG. 4B

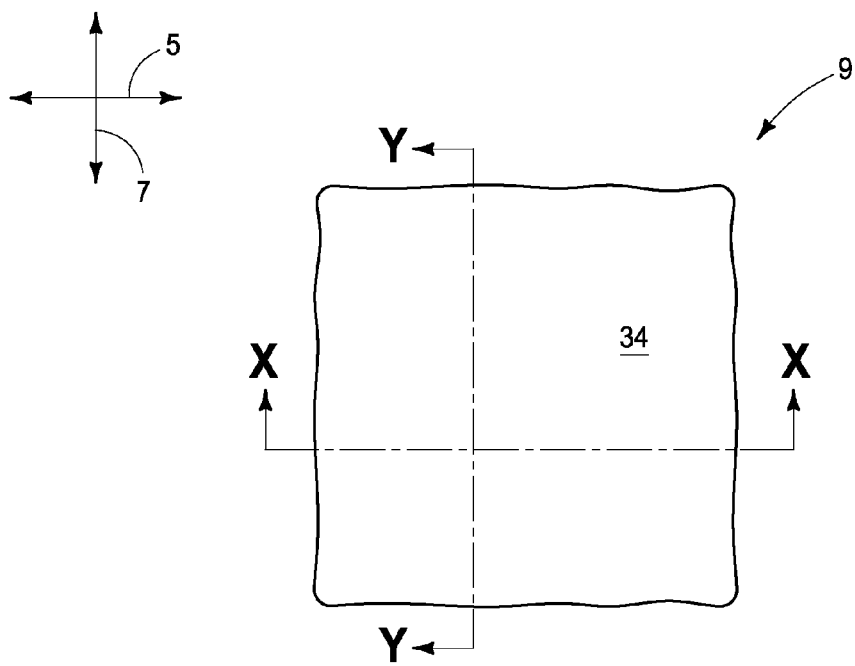
FIG. 5
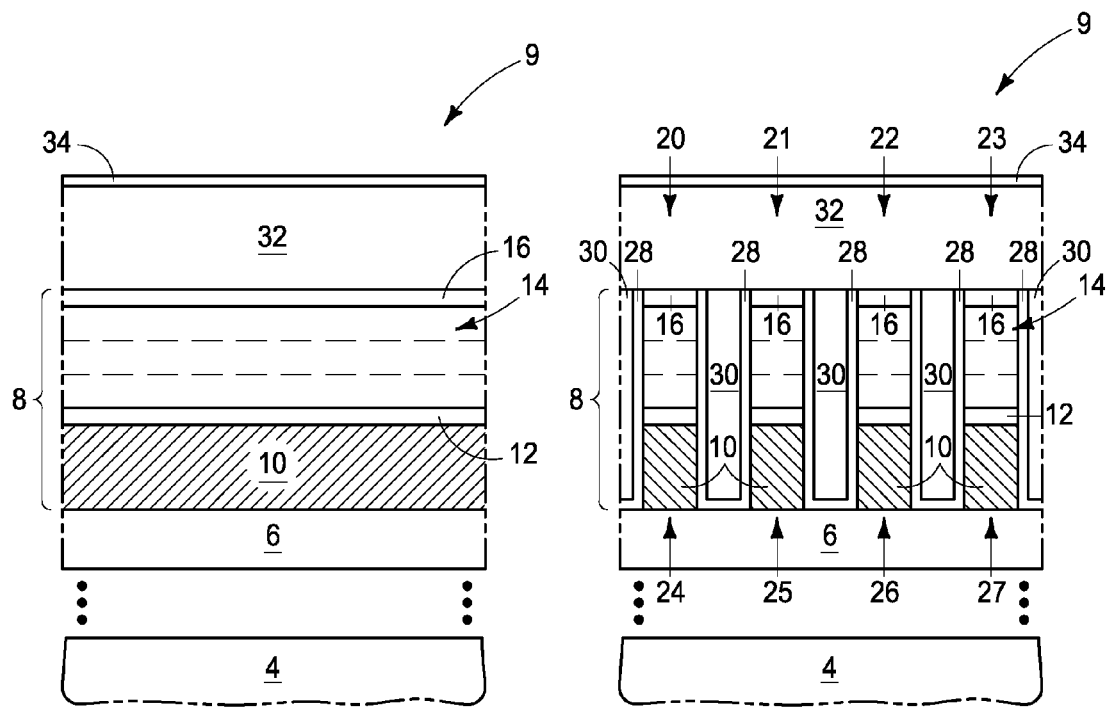
X-X
FIG. 5A
Y-Y
FIG. 5B

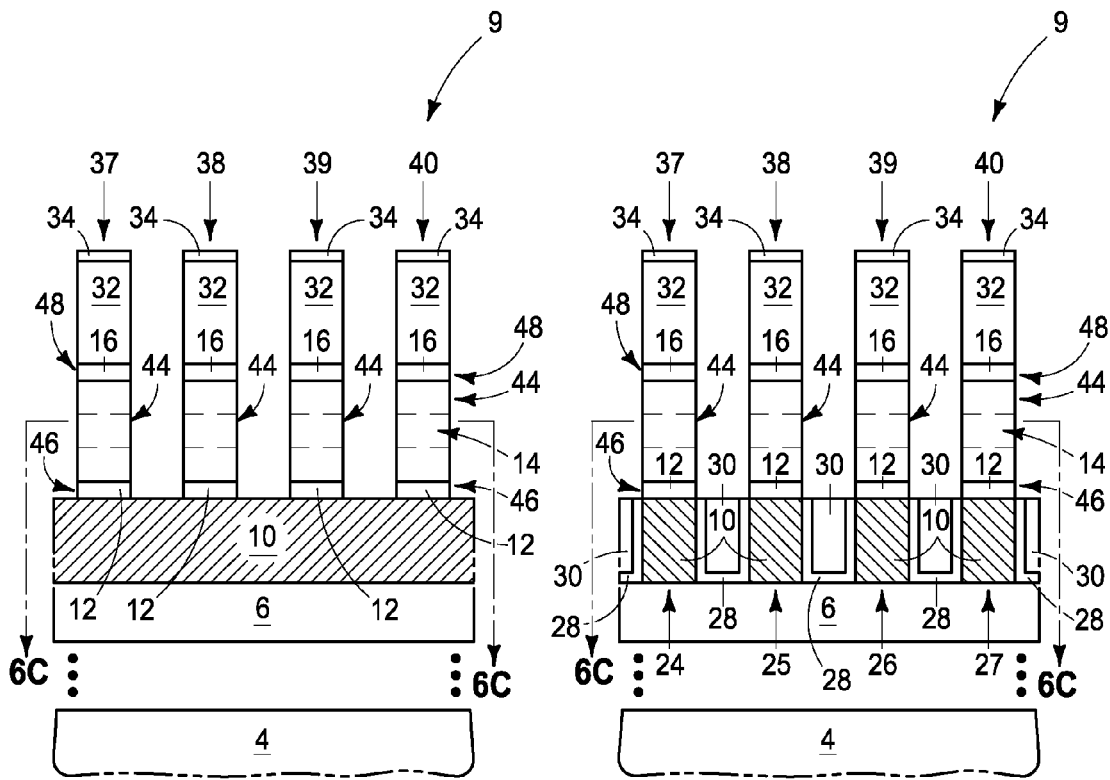
X-X
FIG. 6A
Y-Y
FIG. 6B
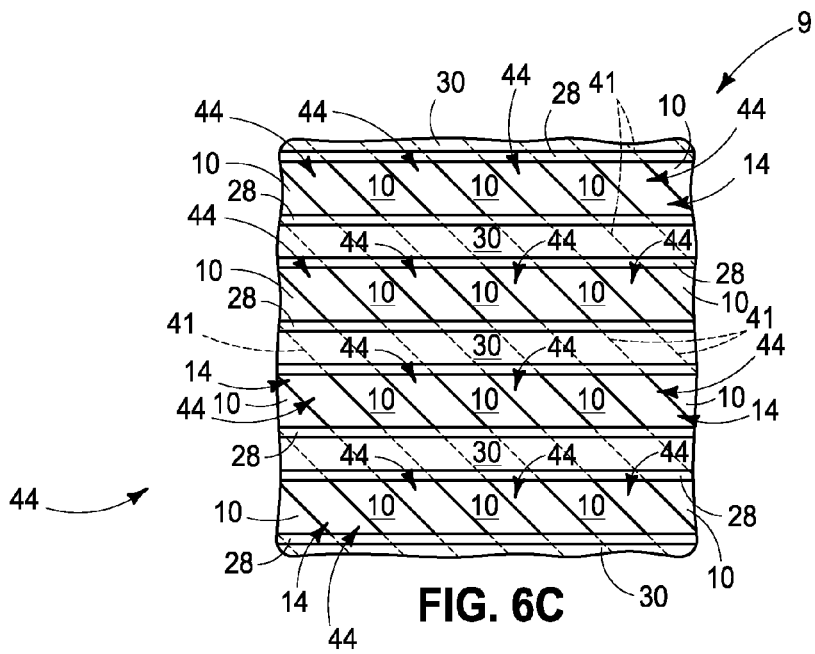
FIG. 6C

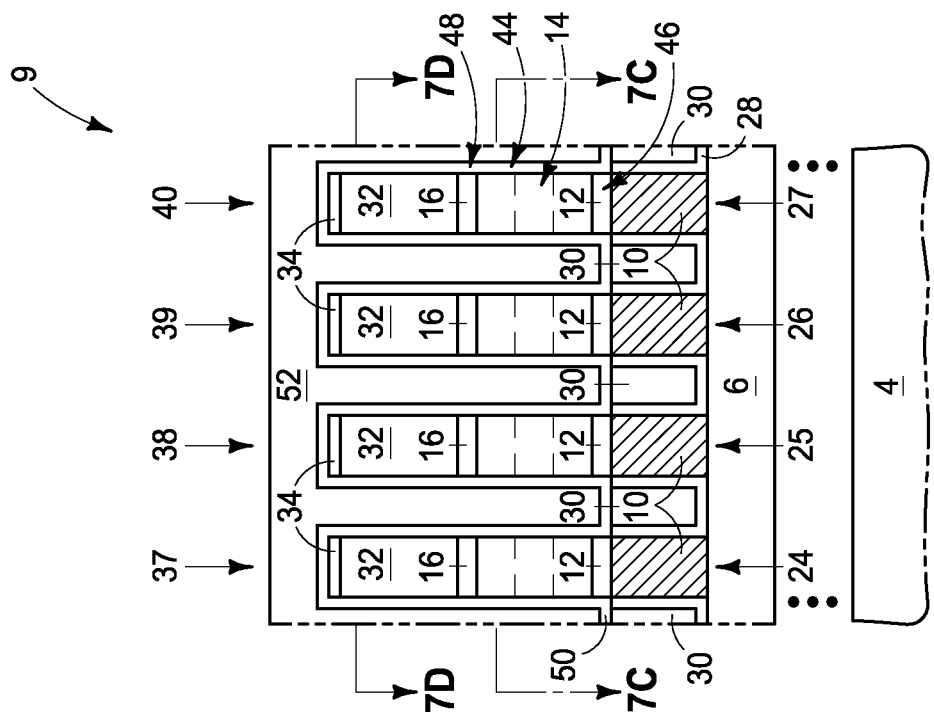
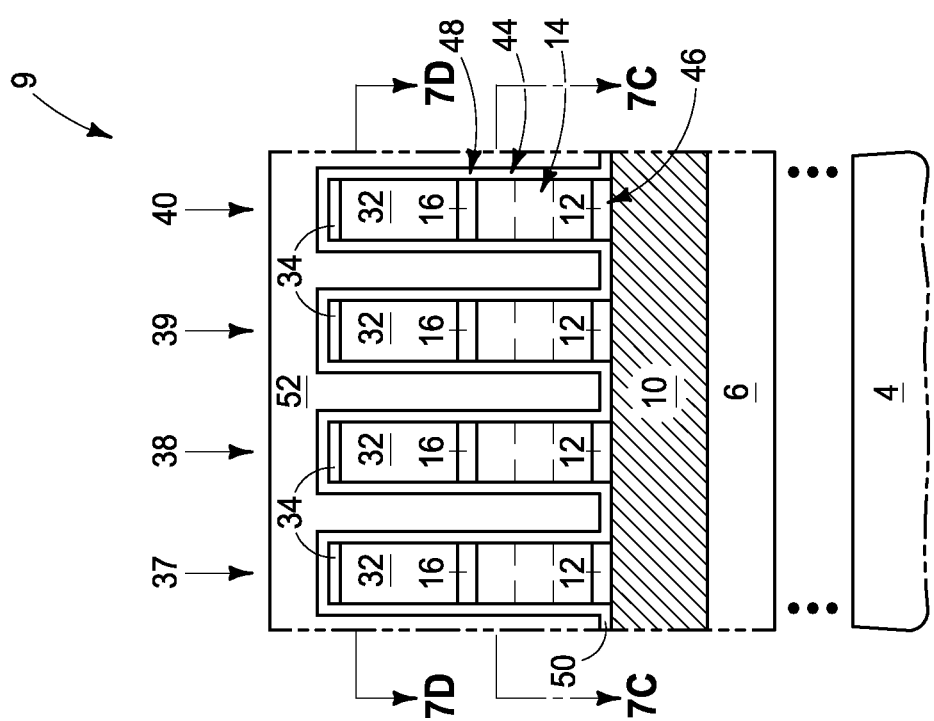

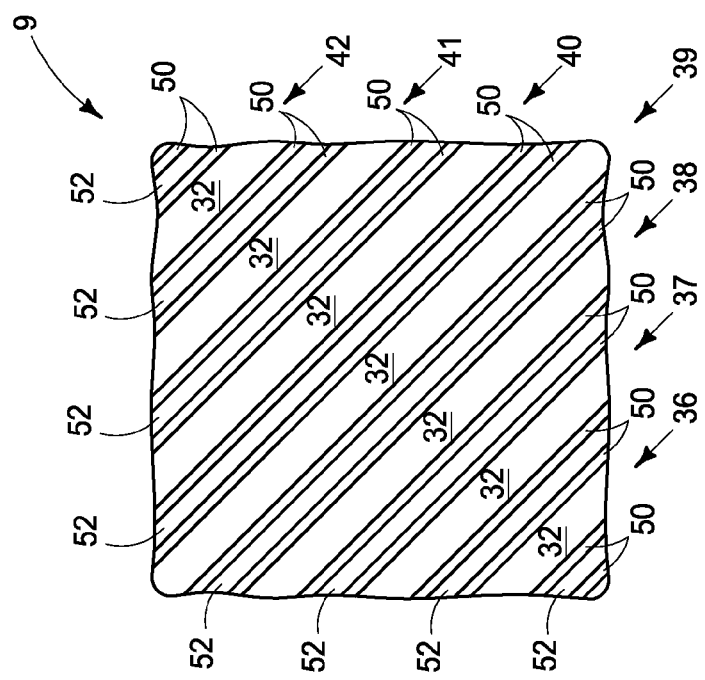
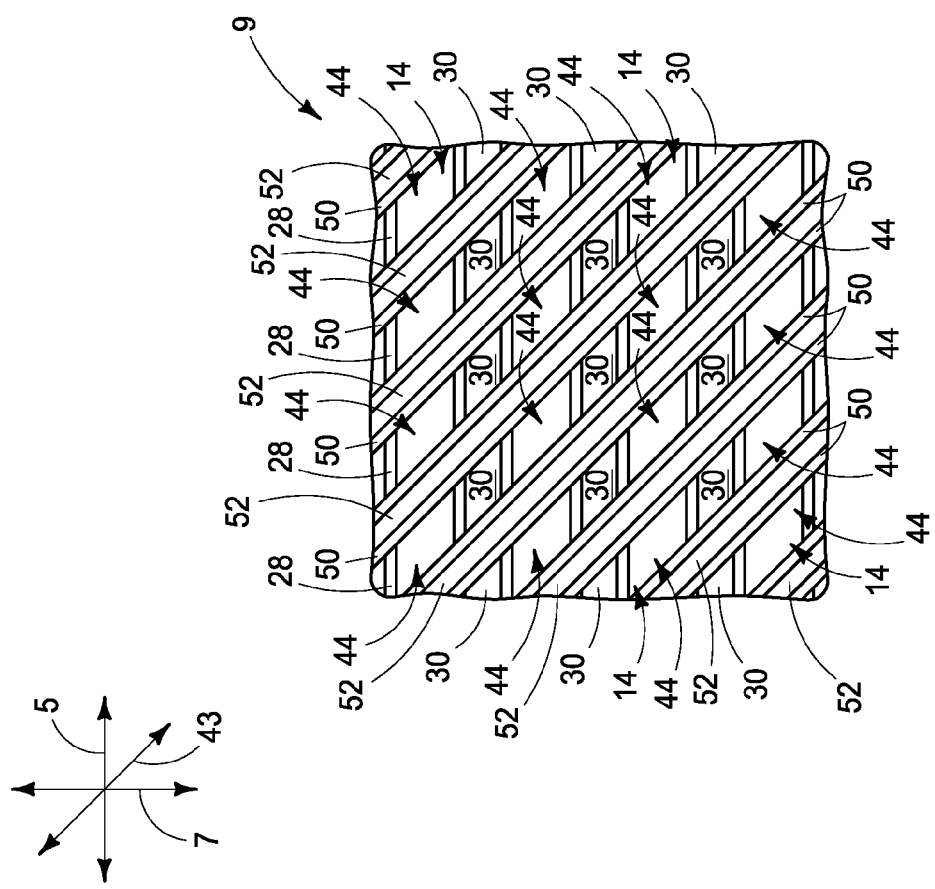
FIG. 7D
FIG. 7C

Y-Y

X-X

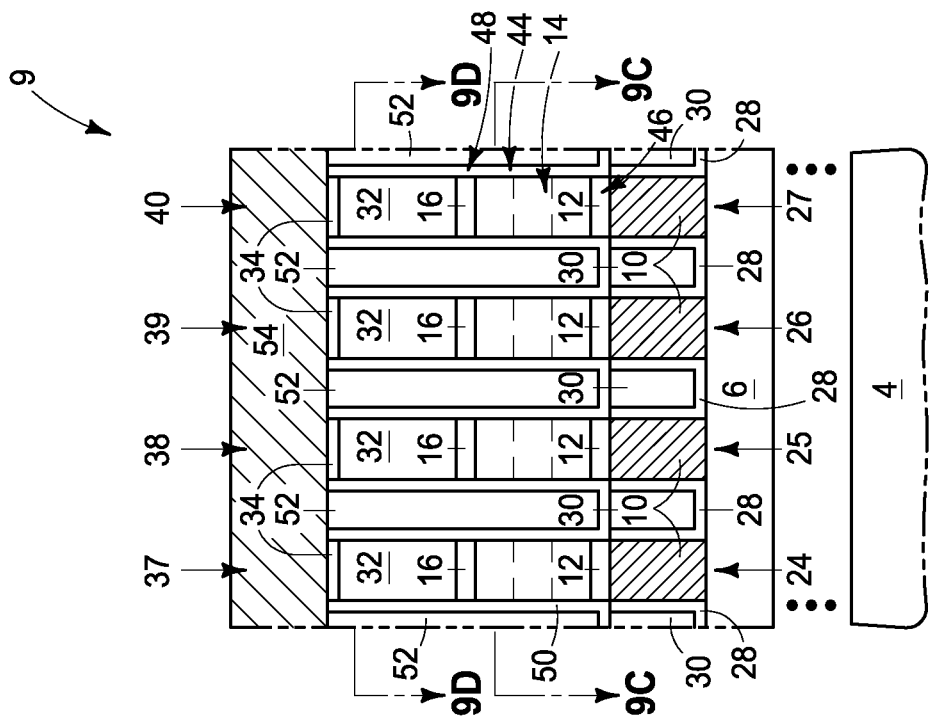
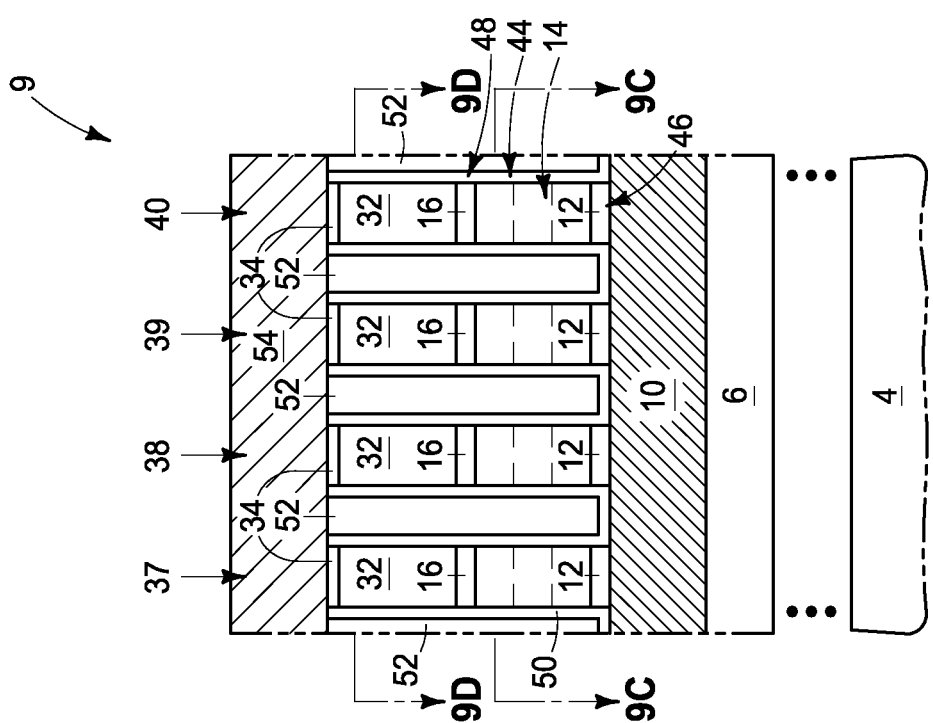
X-X
FIG. 9A
Y-Y
FIG. 9B

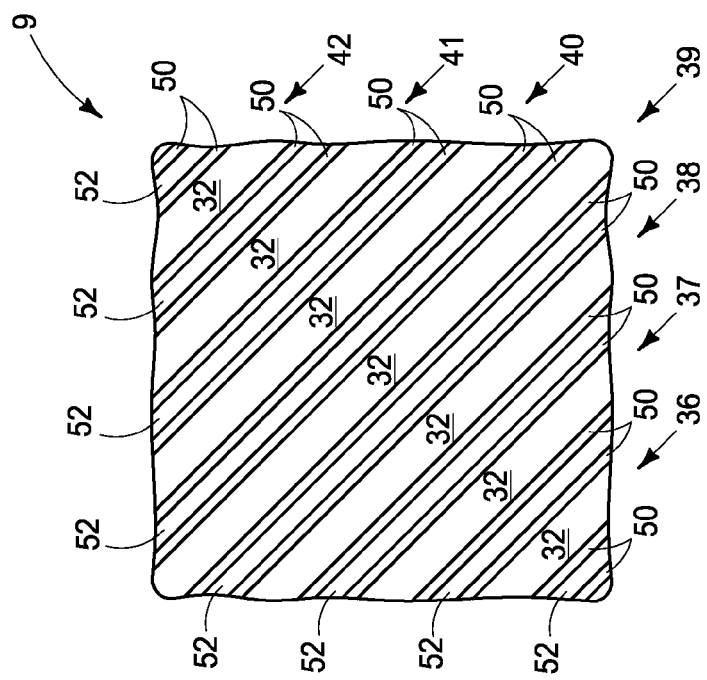
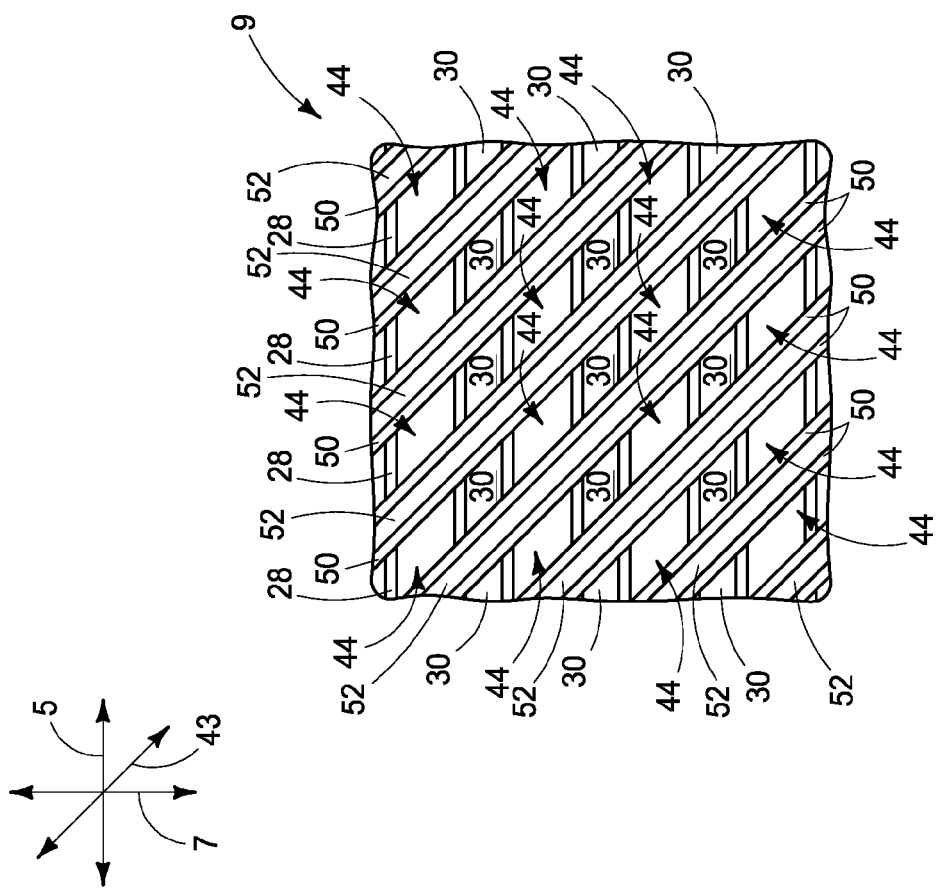
FIG. 9D
FIG. 9C

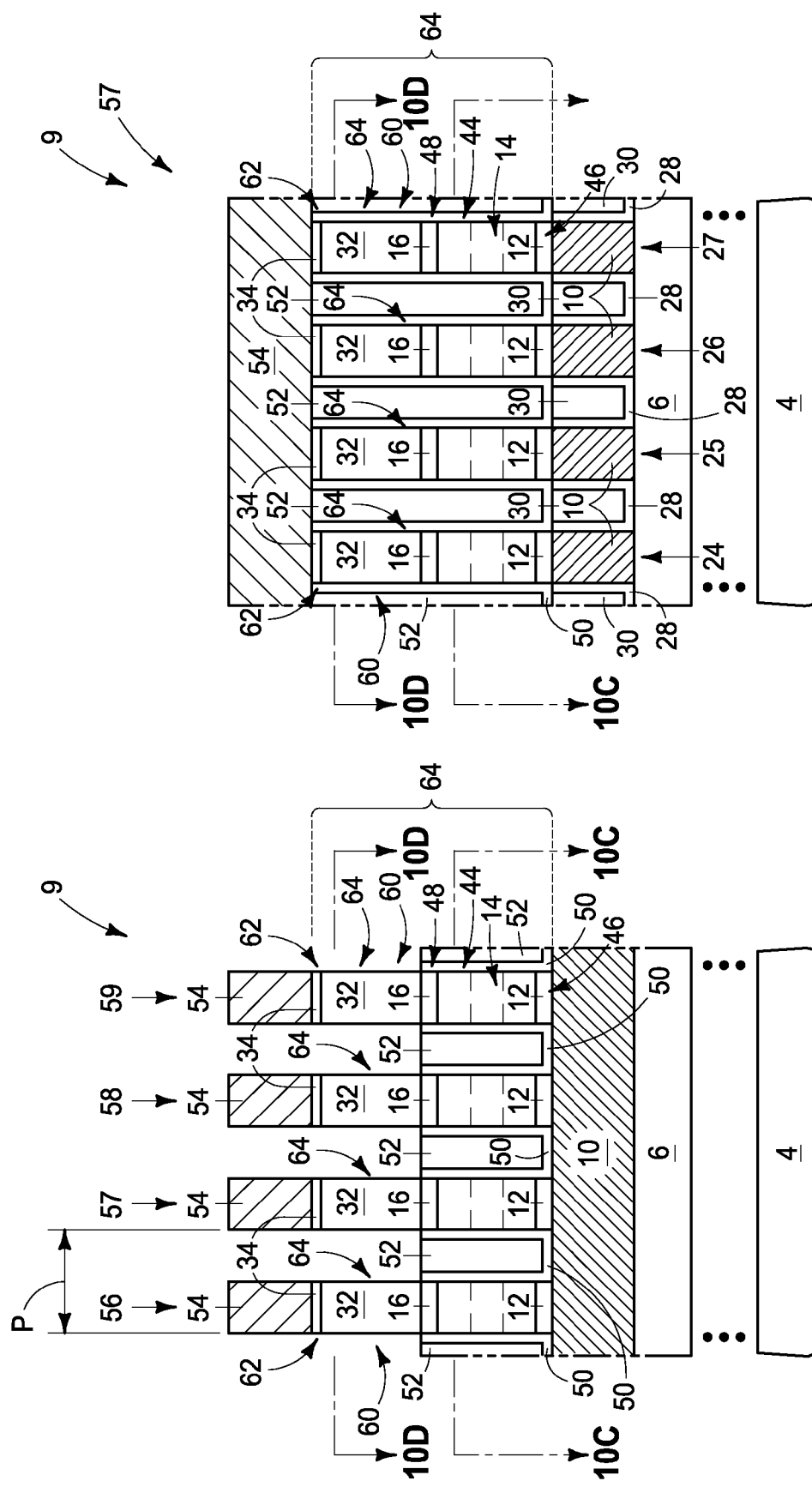

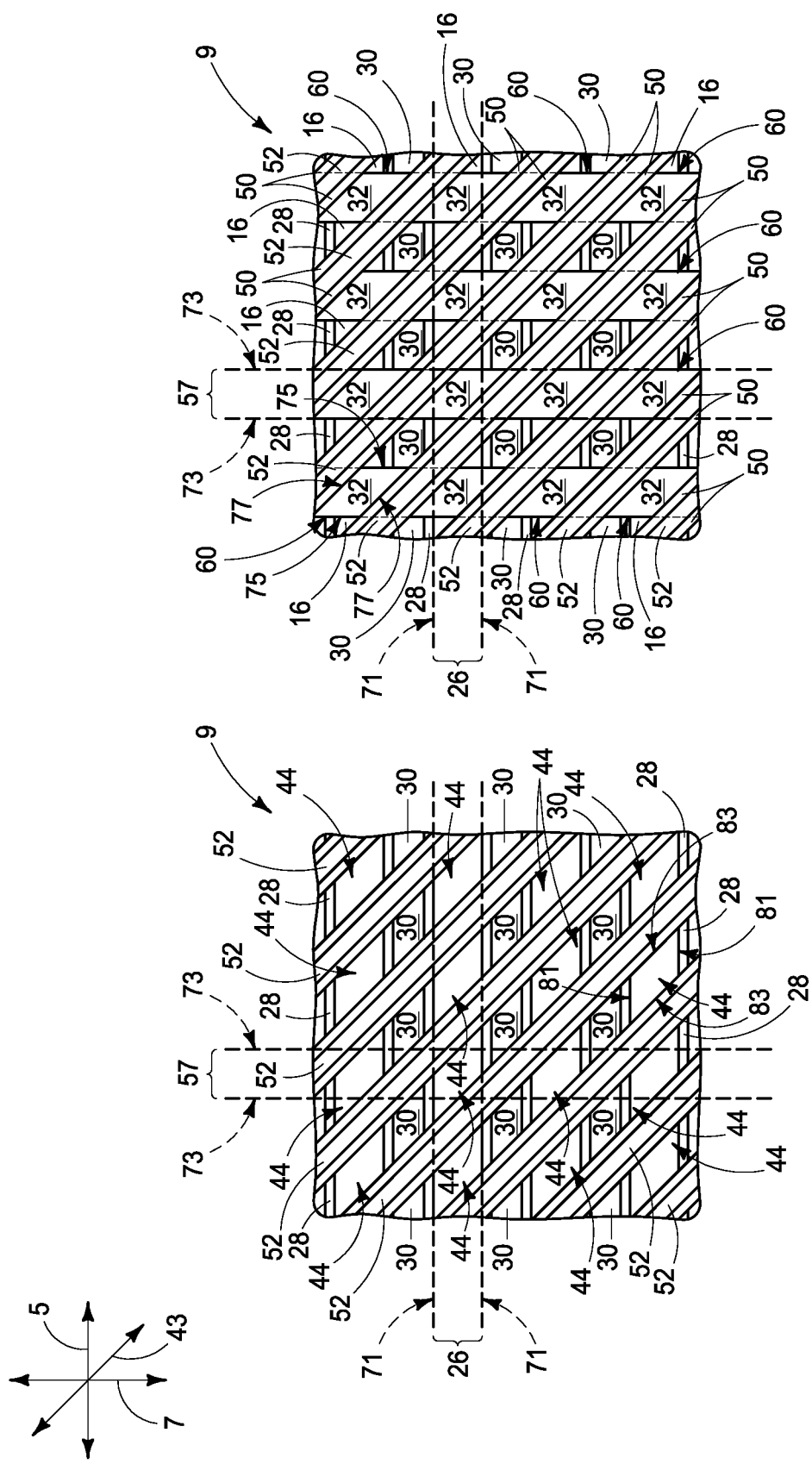

X-X

Y-Y

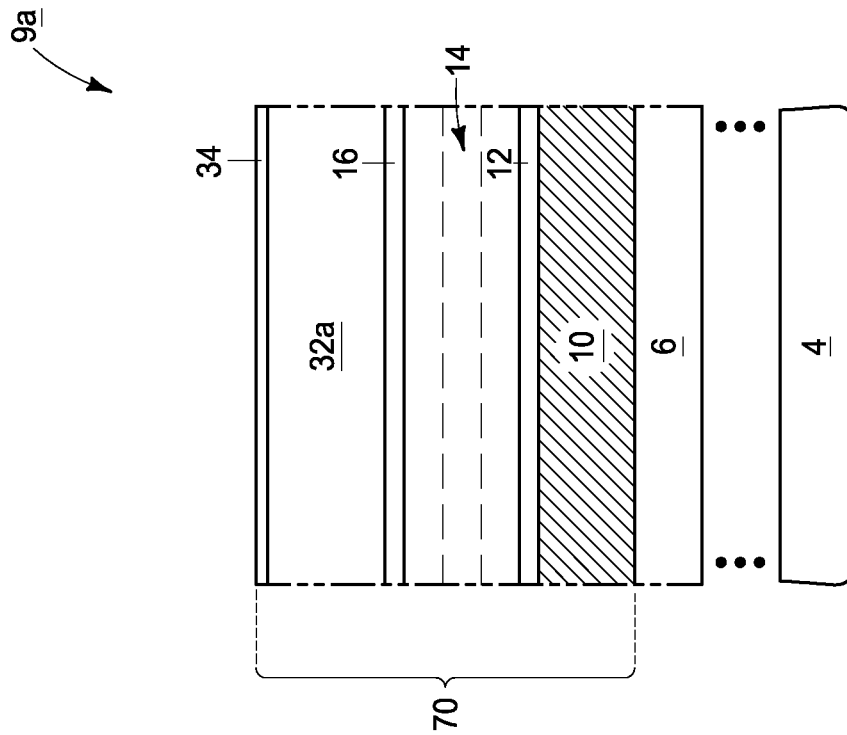
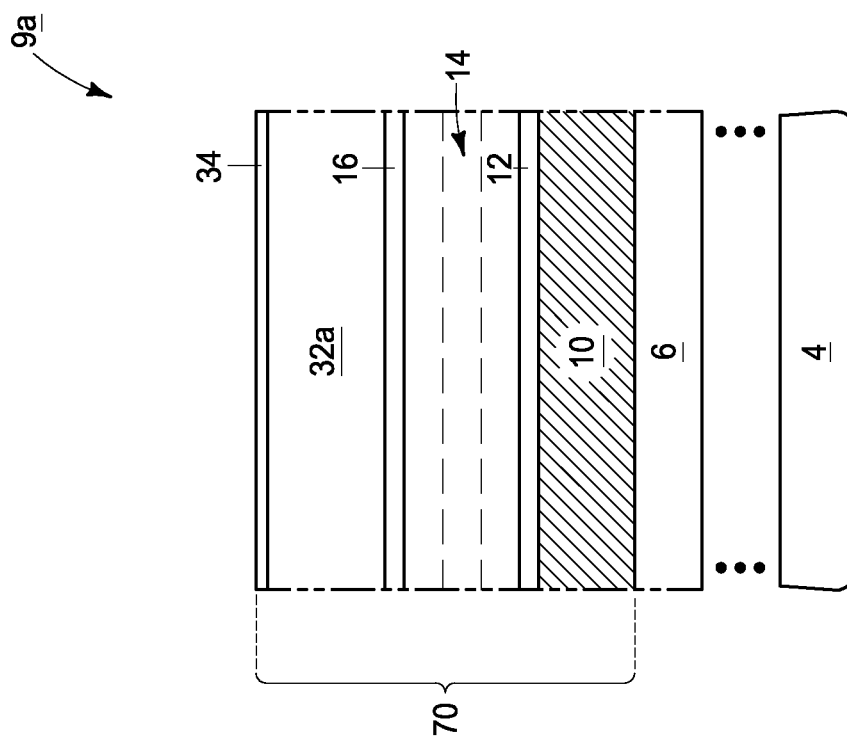

Y-Y

X-X

Y-Y

X-X

Y-Y

X-X

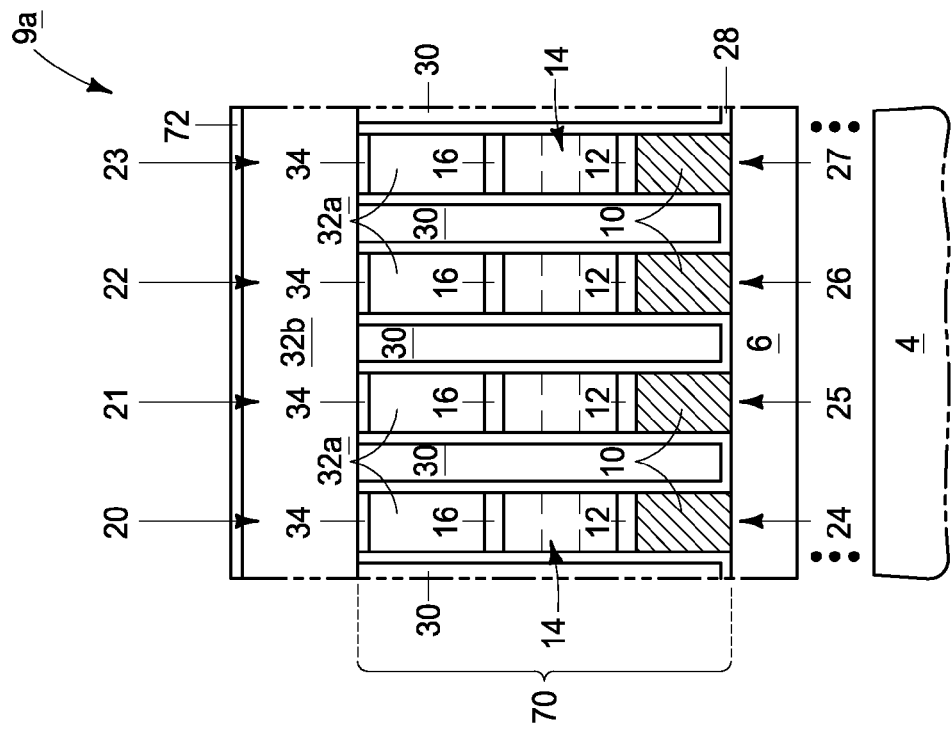
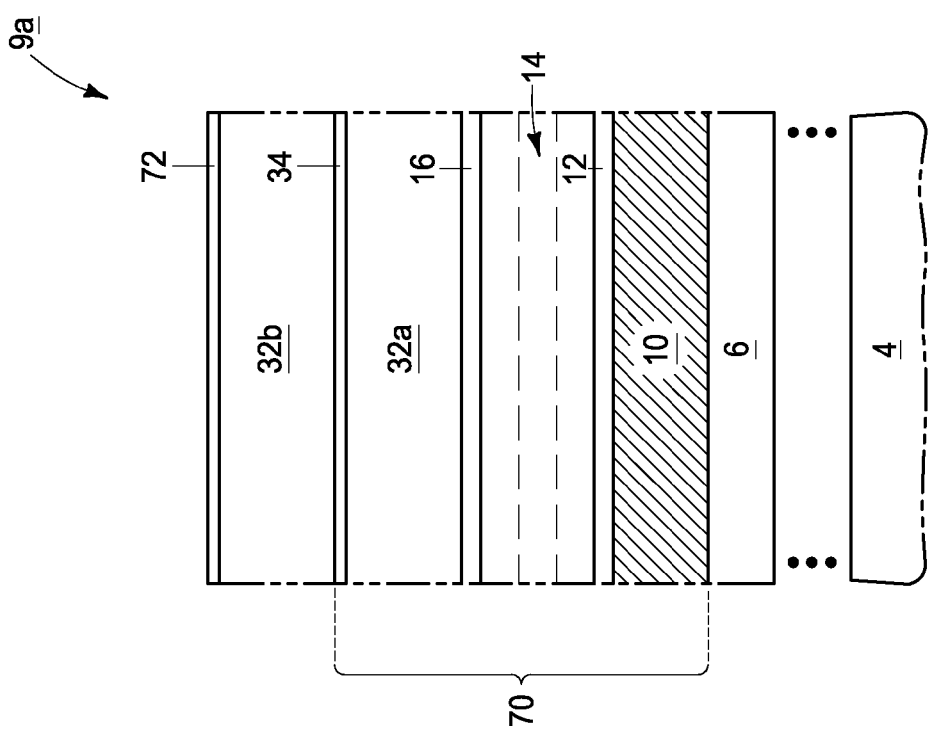
FIG. 16B
Y-Y
FIG. 16A
X-X

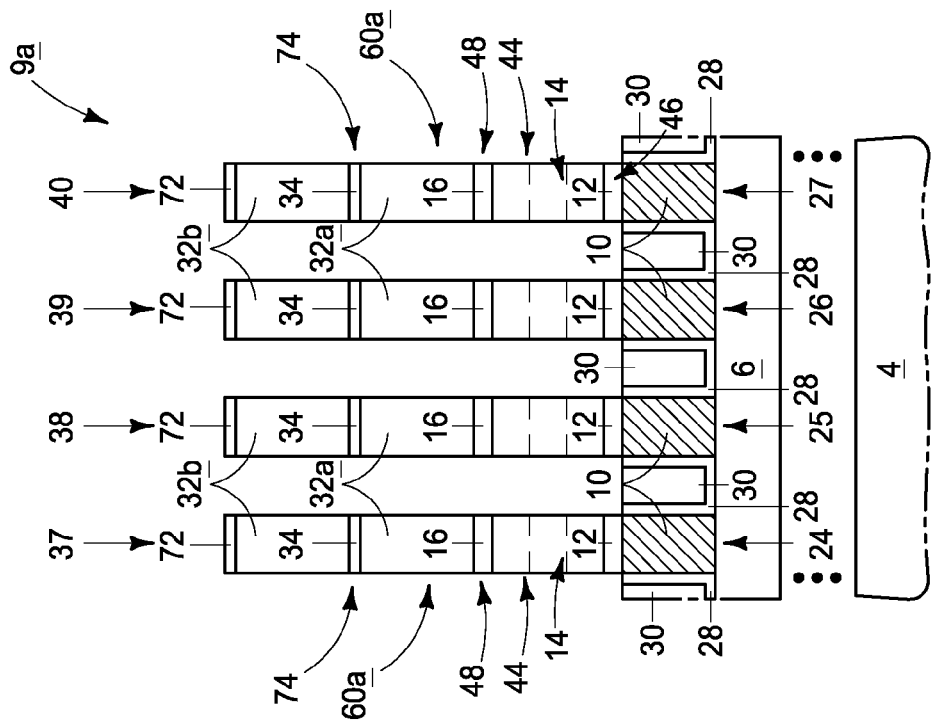
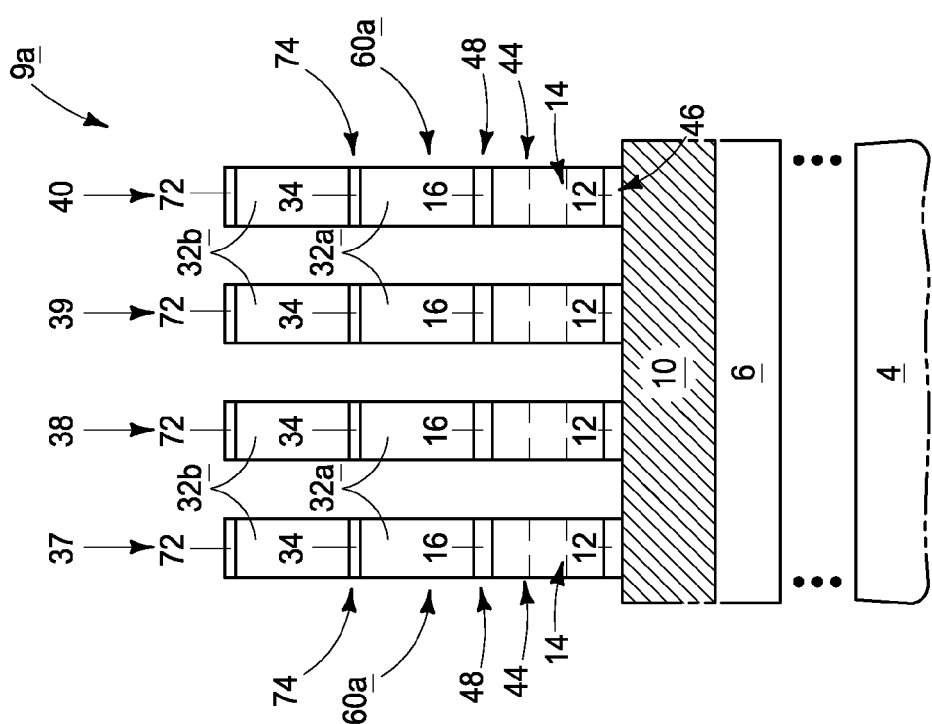

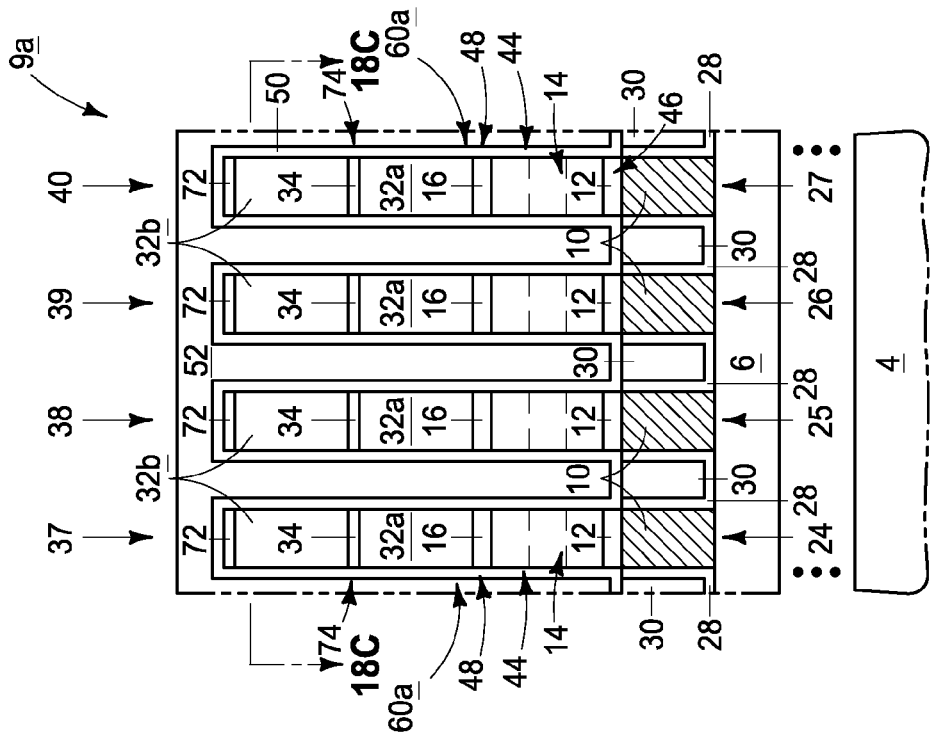
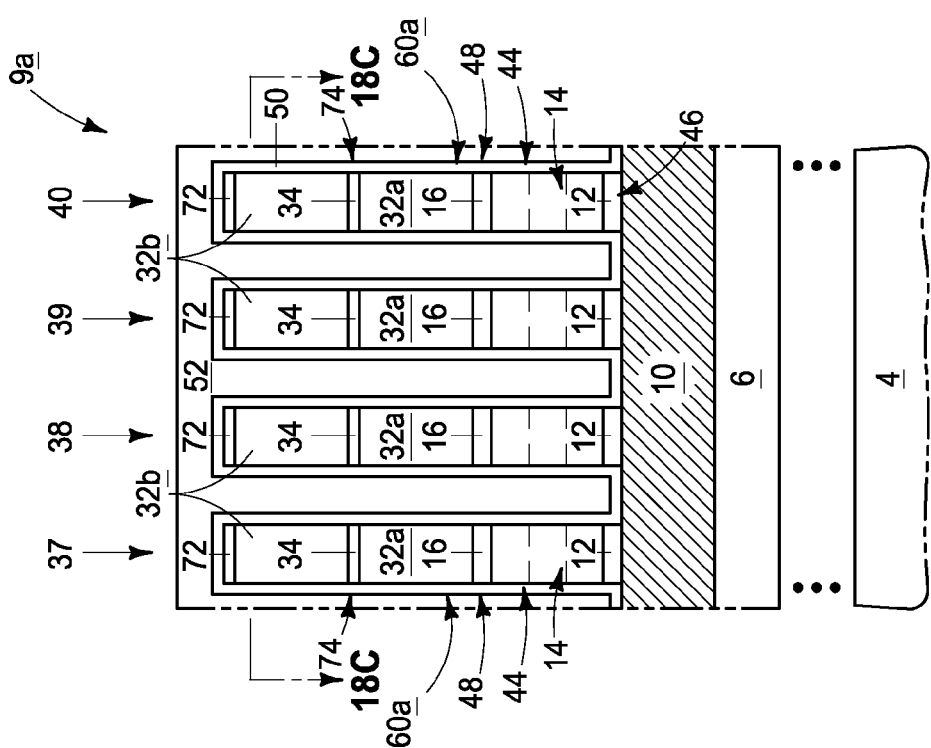

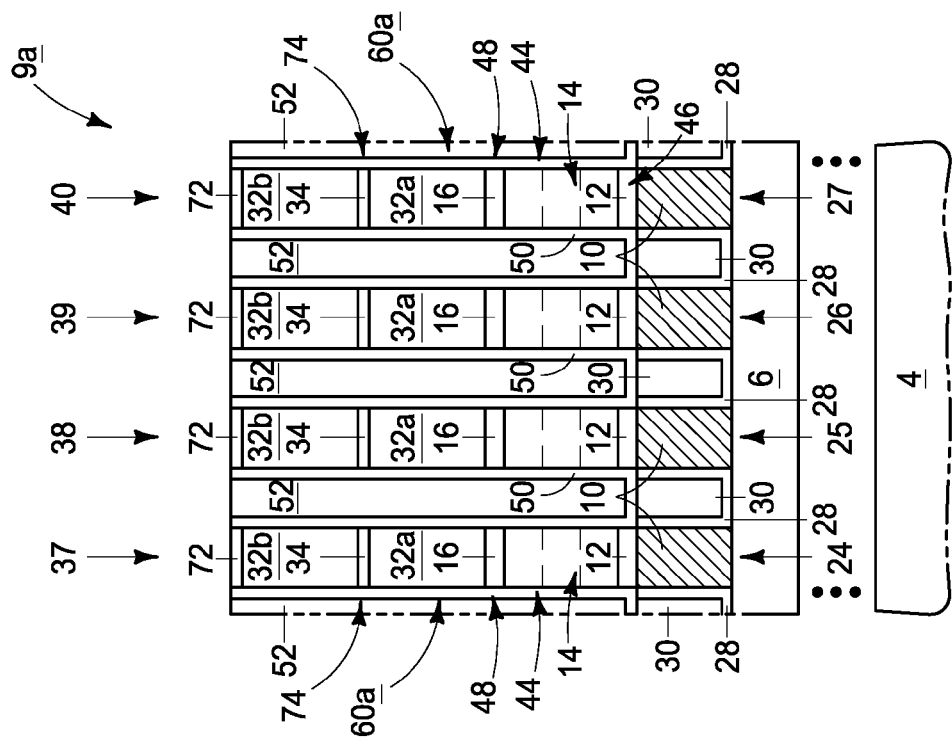
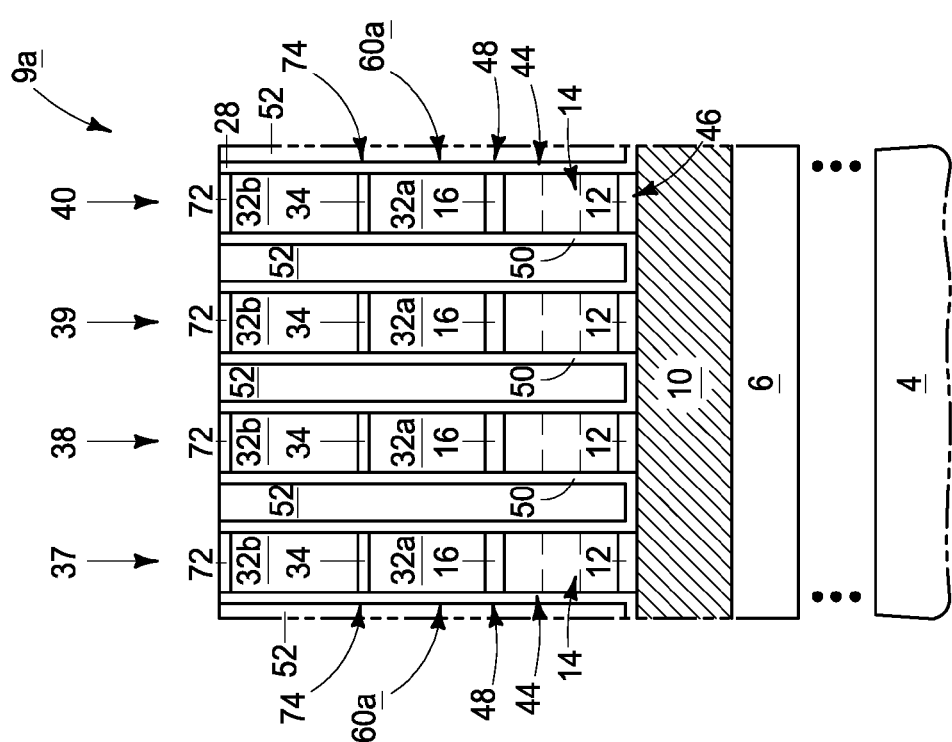

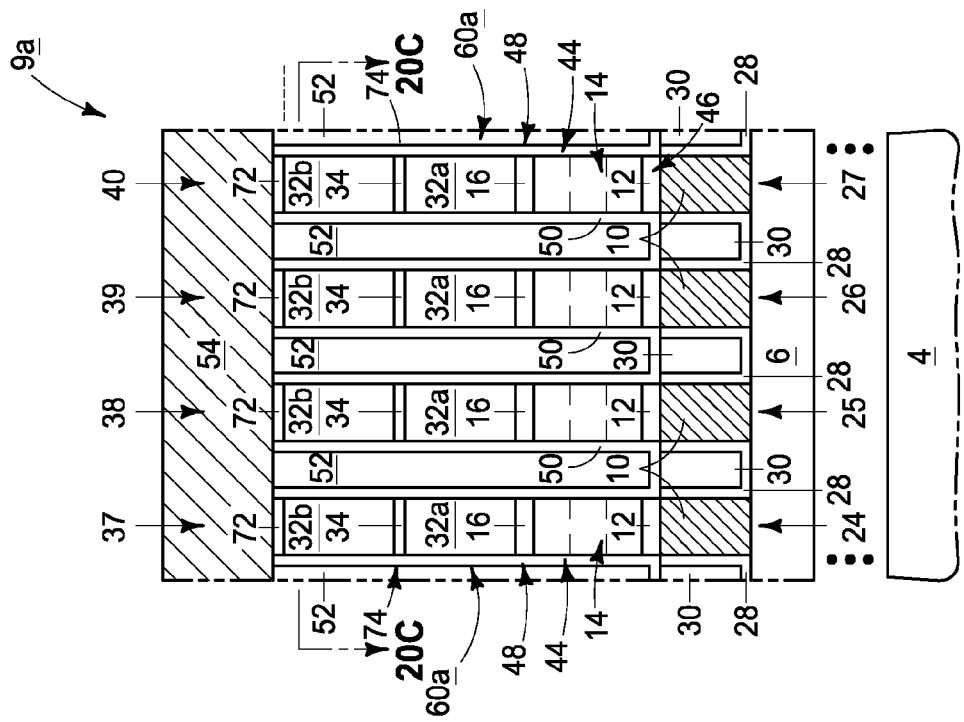
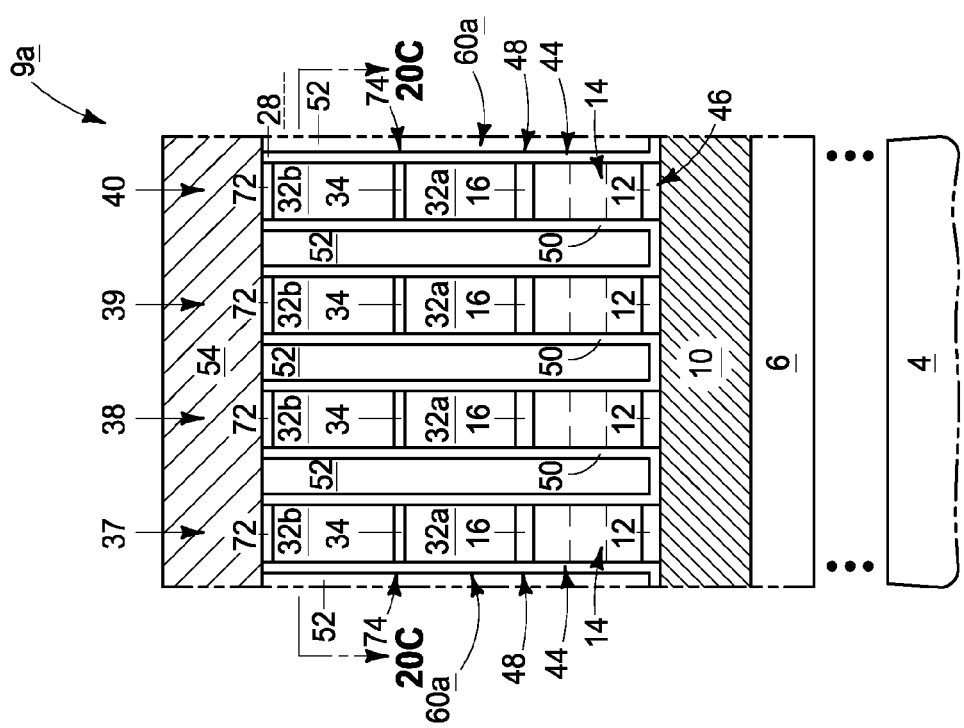

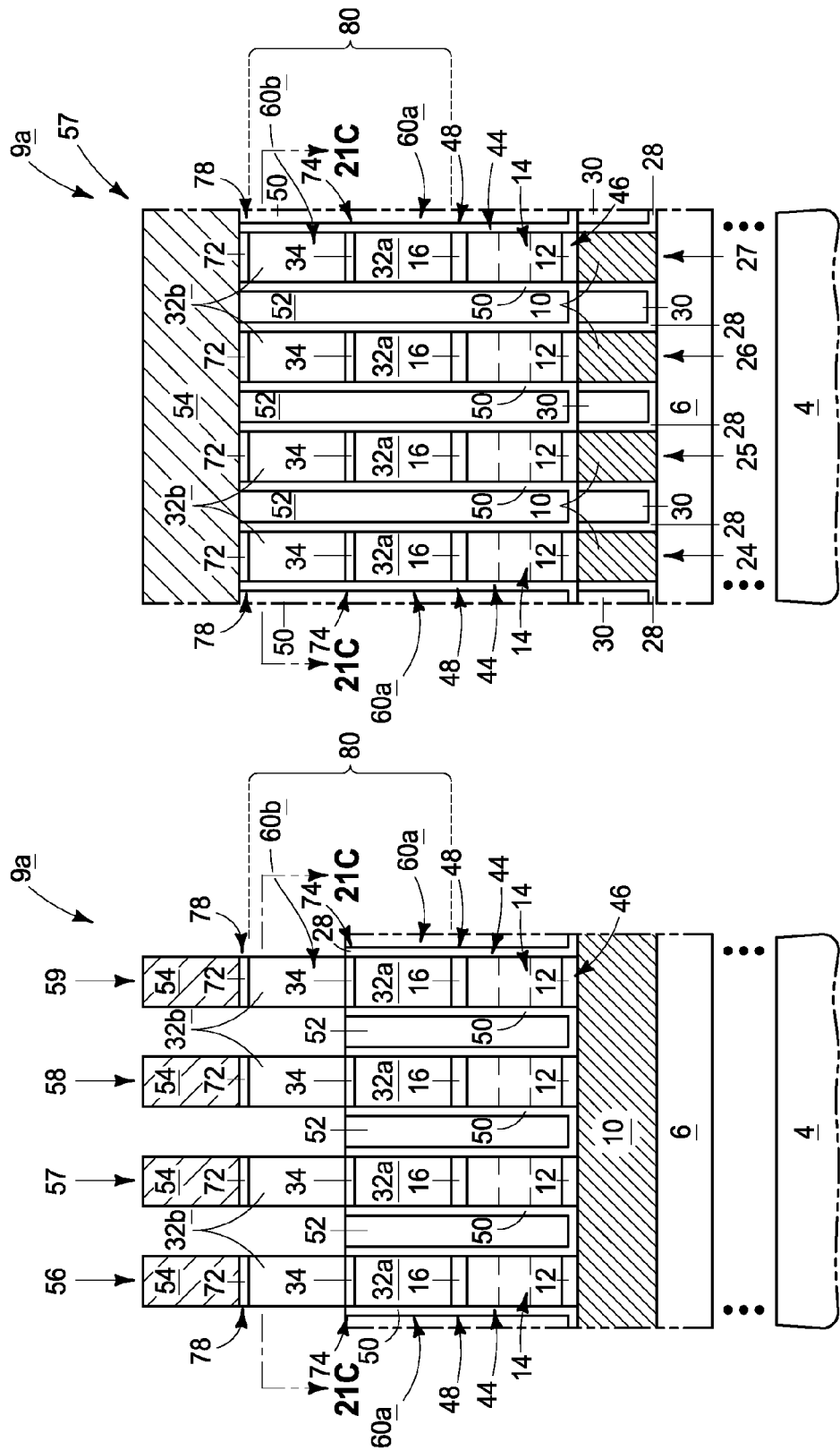

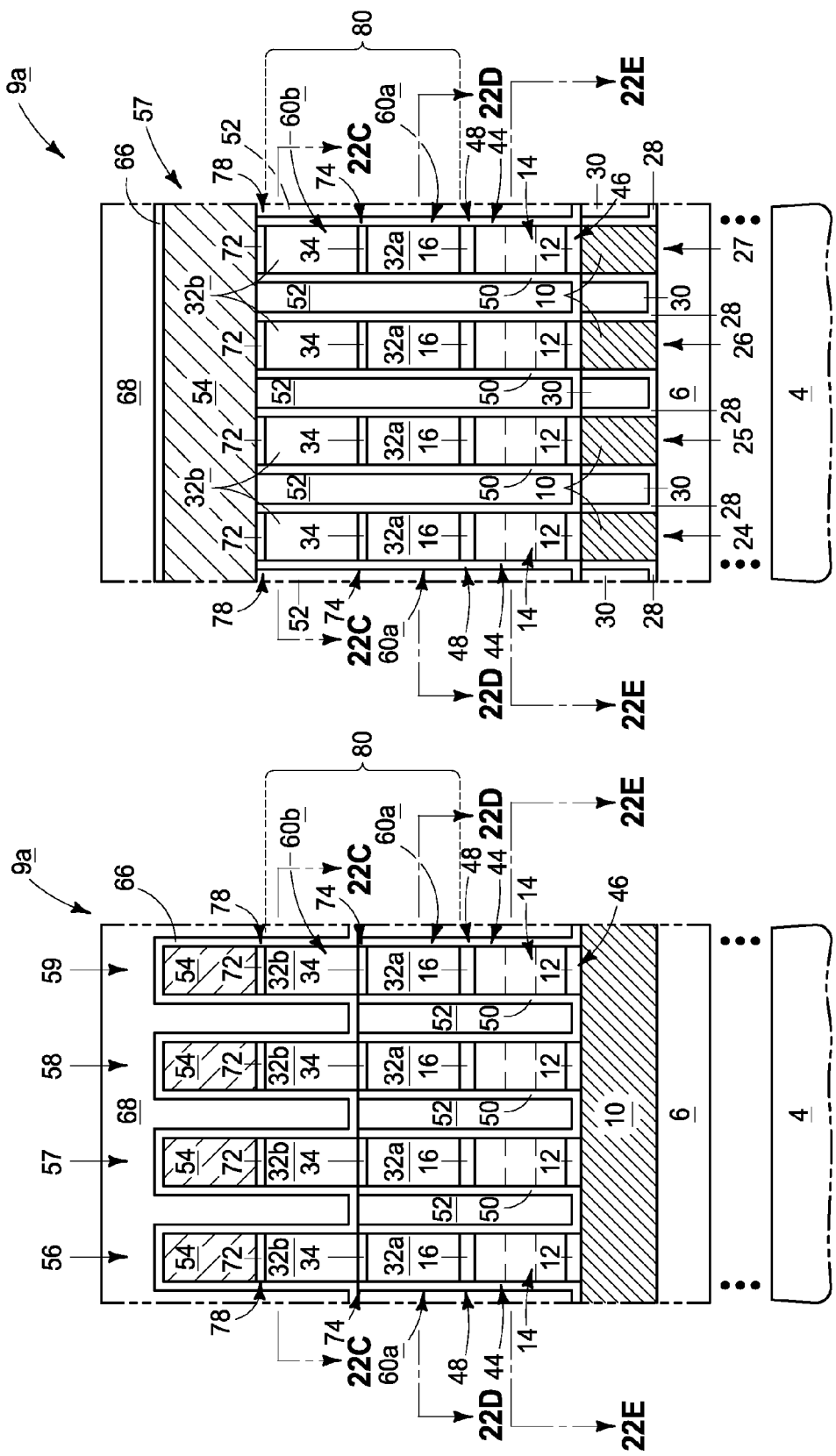

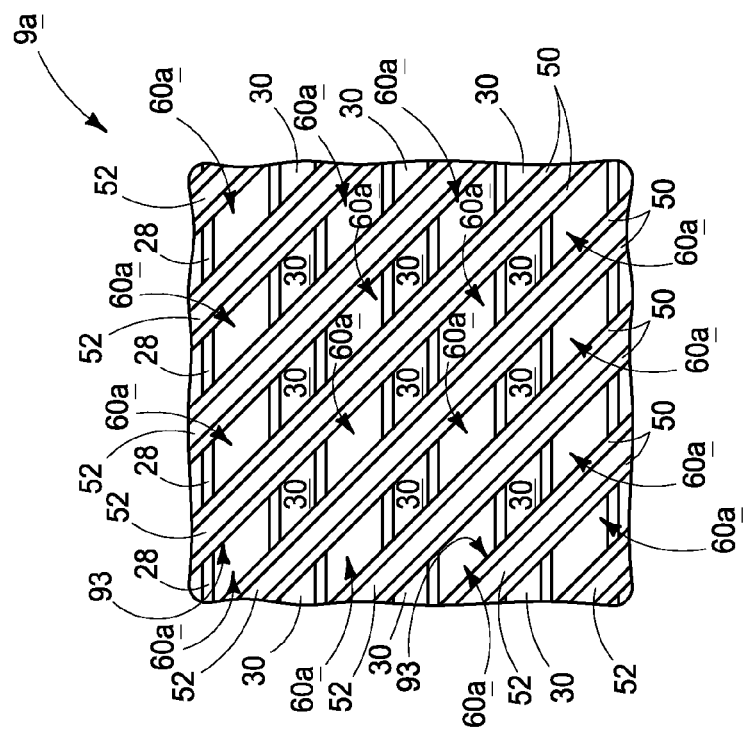
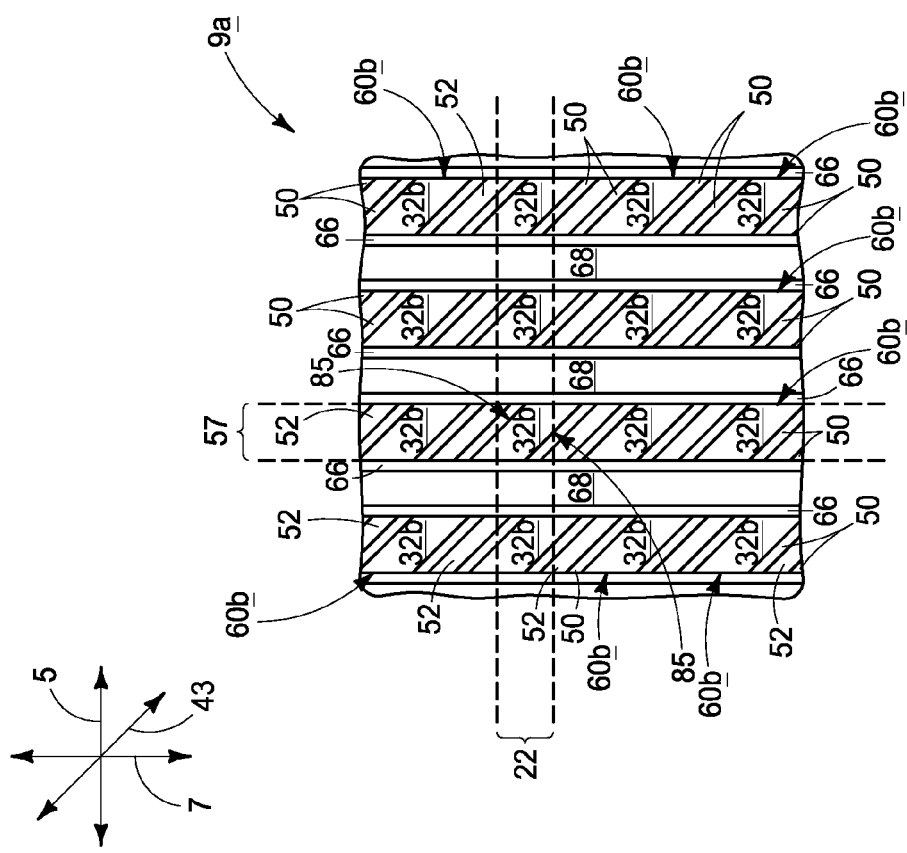
FIG. 22D
FIG. 22C

MEMORY ARRAYS WITH POLYGONAL MEMORY CELLS HAVING SPECIFIC SIDEWALL ORIENTATIONS

TECHNICAL FIELD

Memory arrays and methods of forming memory arrays.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in memory cells that can be utilized in structures having programmable material between a pair of electrodes; where the programmable material has two or more selectable resistive states to enable storing of information. Examples of such memory cells are resistive RAM (RRAM) cells, phase change RAM (PCRAM) cells, and programmable metallization cells (PMCs)—which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs. Additional example memory includes ferroelectric memory, magnetic RAM (MRAM) and spin-torque RAM.

It would be desirable to develop improved memory arrays, and improved methods of forming memory arrays.

BRIEF DESCRIPTION OF THE DRAWINGS

FIGS. 1-1B are a top view and cross-sectional side views of a region of a semiconductor construction at a processing stage of an example embodiment method of forming a memory array. The views of FIGS. 1A and 1B are along the lines X-X and Y-Y of FIG. 1, respectively.

FIGS. 2-2B are a top view and cross-sectional side views of the semiconductor construction of FIGS. 1-1B at a processing stage subsequent to that of FIGS. 1-1B. The views of FIGS. 2A and 2B are along the lines X-X and Y-Y of FIG. 2, respectively.

FIGS. 3-3B are a top view and cross-sectional side views of the semiconductor construction of FIGS. 1-1B at a processing stage subsequent to that of FIGS. 2-2B. The views of FIGS. 3A and 3B are along the lines X-X and Y-Y of FIG. 3, respectively.

FIGS. 4-4B are a top view and cross-sectional side views of the semiconductor construction of FIGS. 1-1B at a processing stage subsequent to that of FIGS. 3-3B. The views of FIGS. 4A and 4B are along the lines X-X and Y-Y of FIG. 4, respectively.

FIGS. 5-5B are a top view and cross-sectional side views of the semiconductor construction of FIGS. 1-1B at a processing stage subsequent to that of FIGS. 4-4B. The views of FIGS. 5A and 5B are along the lines X-X and Y-Y of FIG. 5, respectively.

FIGS. 6-6C are a top view, cross-sectional side views, and a cross-sectional plan view of the semiconductor construction of FIGS. 1-1B at a processing stage subsequent to that of FIGS. 5-5B. The cross-sectional side views of FIGS. 6A and 6B are along the lines X-X and Y-Y of FIG. 6, respectively; and the cross-sectional plan view of FIG. 6C is along the lines 6C-6C of FIGS. 6A and 6B.

FIGS. 7-7D are a top view, cross-sectional side views, and cross-sectional plan views of the semiconductor construction of FIGS. 1-1B at a processing stage subsequent to that of FIGS. 6-6C. The cross-sectional side views of FIGS. 7A and 7B are along the lines X-X and Y-Y of FIG. 7, respectively; and the cross-sectional plan views of FIGS. 7C and 7D are along the lines 7C-7C and 7D-7D of FIGS. 7A and 7B.

FIGS. 9-9D are a top view, cross-sectional side views, and cross-sectional plan views of the semiconductor construction of FIGS. 1-1B at a processing stage subsequent to that of FIGS. 8-8C. The cross-sectional side views of FIGS. 9A and 9B are along the lines X-X and Y-Y of FIG. 9, respectively; and the cross-sectional plan views of FIGS. 9C and 9D are along the lines 9C-9C and 9D-9D of FIGS. 9A and 9B.

FIGS. 10-10D are a top view, cross-sectional side views, and cross-sectional plan views of the semiconductor construction of FIGS. 1-1B at a processing stage subsequent to that of FIGS. 9-9D. The cross-sectional side views of FIGS. 10A and 10B are along the lines X-X and Y-Y of FIG. 10, respectively; and the cross-sectional plan views of FIGS. 10C and 10D are along the lines 10C-10C and 10D-10D of FIGS. 10A and 10B.

FIGS. 12-12B are a top view and cross-sectional side views of a region of a semiconductor construction at a processing stage of another example embodiment method of forming a memory array. The views of FIGS. 12A and 12B are along the lines X-X and Y-Y of FIG. 12, respectively.

FIGS. 16-16B are a top view and cross-sectional side views of the semiconductor construction of FIGS. 12-12B at a processing stage subsequent to that of FIGS. 15-15B. The views of FIGS. 16A and 16B are along the lines X-X and Y-Y of FIG. 16, respectively.

FIGS. 17-17B are a top view and cross-sectional side views of the semiconductor construction of FIGS. 12-12B at a processing stage subsequent to that of FIGS. 16-16B. The views of FIGS. 17A and 17B are along the lines X-X and Y-Y of FIG. 17, respectively.

FIGS. 19-19B are a top view and cross-sectional side views of the semiconductor construction of FIGS. 12-12B at a processing stage subsequent to that of FIGS. 18-18C. The views of FIGS. 19A and 19B are along the lines X-X and Y-Y of FIG. 19, respectively.

DETAILED DESCRIPTION OF THE ILLUSTRATED EMBODIMENTS

Figure 6:
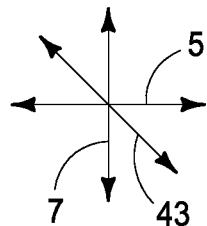
Figure 6:
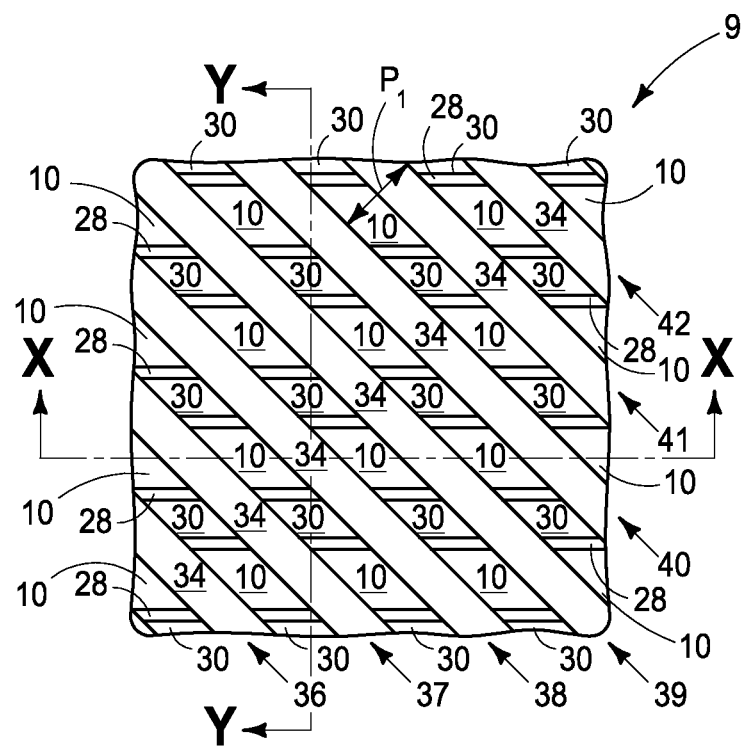

In some embodiments, the invention includes memory arrays in which memory cells are provided within pillars between lower access/sense lines and upper access/sense lines, and in which upper portions of the pillars have different peripheral configurations than lower portions of the pillars. Such configurations may improve structural integrity of the pillars relative to conventional configurations. Some embodiments include new methods of forming memory arrays. Example embodiments are described below with reference to FIGS. 1-22.

Referring to FIGS. 1-1B, a portion of a construction 9 is illustrated at a processing stage of an example embodiment method for fabricating an example embodiment memory array.

The construction 9 comprises a semiconductor base 4, and an electrically insulative material 6 supported over the base 4. The insulative material 6 is shown spaced from the base 4 to indicate that there may be one or more other materials and/or integrated circuit levels between the base 4 and the insulative material 6.

The base 4 may comprise semiconductor material; and may, for example, comprise, consist essentially of, or consist of monocrystalline silicon. In some embodiments, base 4 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, base 4 may correspond to a semiconductor substrate containing one or more materials associated with integrated circuit fabrication. Some of the materials may be between the shown region of base 4 and the insulative material 6 and/or may be laterally adjacent the shown region of base 4; and may correspond to, for example, one or more of refractory metal materials, barrier materials, diffusion materials, insulator materials, etc.

The insulative material 6 may comprise any suitable composition or combination of compositions; including, for example, one or more of various oxides (for instance, silicon dioxide, borophosphosilicate glass, etc.), silicon nitride, etc.

A stack 8 of materials is formed over the insulative material 6. Such stack includes access/sense material 10, first electrode material 12, one or more select device materials 14, and second electrode material 16.

The access/sense material 10 is electrically conductive and may comprise any suitable composition or combination of compositions. In some embodiments, material 10 may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In some embodiments, the access/sense material 10 may be referred to as a first access/sense material to distinguish it from other access/sense materials formed later.

The electrode materials 12 and 16 may comprise any suitable compositions or combinations of compositions; and in some embodiments may comprise, consist essentially of, or consist of carbon. The electrode materials 12 and 16 may be the same as one another in some embodiments, and may differ from one another in other embodiments.

The select device material is ultimately utilized to form select devices suitable for utilization in a memory array. The select devices may be any suitable devices; including, for example, diodes, bipolar junction transistors, field effect transistors, switches, etc. Different materials of the select devices are diagrammatically illustrated in FIGS. 1A and 1B using dashed lines to indicate approximate boundaries between various materials of example devices, and using label 14 to refer generally to all of the various materials of the select devices.

Referring to FIGS. 2-2B, stack 8 is patterned into lines 20-23 extending along the direction of an axis 5. Such direction may be referred to as a first direction in the discussion that follows, and is orthogonal to a second direction designated by an axis 7. The lines 20-23 are on a pitch "P". Such pitch may comprise any suitable dimension, and in some embodiments may be within a range of from about 40 nm to about 200 nm.

The lines 20-23 may be formed with any suitable processing. For instance, a patterned mask (not shown) may be formed over stack 8, a pattern may be transferred from the mask into the materials of stack 8 with one or more suitable etches, and then the mask may be removed to leave the construction of FIGS. 2-2B. The mask may be a lithographic mask (for instance, a photolithographically-patterned photoresist mask) or a sublithographic mask (for instance, a mask formed utilizing pitch-multiplication methodologies).

The patterned access/sense material 10 forms a series of access/sense lines 24-27. In some embodiments, the lines 24-27 may be referred to as first access/sense lines to distinguish them from other access/sense lines formed later.

Referring to FIGS. 3-3B, insulative materials 28 and 30 are formed over and between the lines 20-23. The materials 28 and 30 may comprise any suitable electrically insulative compositions, or combinations of compositions. In some embodiments, insulative material 28 may comprise, consist essentially of, or consist of silicon nitride; and insulative material 30 may comprise, consist essentially of, or consist of silicon dioxide. Although two insulative materials (28 and 30) are shown, in other embodiments only a single insulative material may be formed over and between the lines 20-23, and in yet other embodiments more than two insulative materials may be formed over and between the lines 20-23.

Referring to FIGS. 4-4B, the insulative materials 28 and 30 are removed from over lines 20-23, which exposes a surface of the second electrode material 16 at the tops of the lines. In some embodiments, the materials 28 and 30 may be removed utilizing planarization, such as, for example, chemical-mechanical polishing (CMP).

Referring to FIGS. 5-5B, programmable material 32 is formed across lines 20-23; and in the shown embodiment is formed over and directly against the exposed upper surfaces of electrode material 16.

The programmable material may comprise any suitable composition. In some embodiments, the programmable material may comprise a phase change material, such as a chalcogenide. For example, the programmable material may comprise germanium, antimony and tellurium; and may correspond to a chalcogenide commonly referred to as GST. In other example embodiments, the programmable material may comprise other compositions suitable for utilization in other types of memory besides phase change memory. For instance, the programmable material may comprise one or more compositions suitable for utilization in CBRAM or other types of resistive RAM.

The programmable material may be formed to any suitable thickness, and in some embodiments may be formed to a vertical thickness of at least about 60 nm; such as, for example, a vertical thickness of from about 60 nm to about 100 nm. Such thicknesses may be significantly greater than conventional thicknesses of programmable material. Ultimately, the programmable material is incorporated into pillars (for instance, pillars described below with reference to FIGS. 10-10D). Conventional processing utilizes two crossing patterns to pattern the programmable material to have a simple square or rectangular peripheral shape. In embodiments described herein, an additional crossing pattern is utilized so that at least some of the programmable material within the pillars has a different peripheral shape than a simple rectangle or square, which can improve structural integrity of the pillars and thereby enable thicker programmable material to be utilized. The improved structure integrity may enable the pillars to be less susceptible to tipping and/or other structural problems. The greater thickness of the programmable material may enable memory cells to be formed having desired rapid switching characteristics while also having improved separation between different memory states (e.g., "SET" and "RESET" memory states) as compared to memory cells having thinner programmable material.

In the shown embodiment, a third electrode material 34 is formed over programmable material 32. The third electrode material may comprise any suitable composition or combination of compositions; and in some embodiments may comprise, consist essentially of, or consist of carbon. The third electrode material 34 may be a same composition as one or both of the first and second electrode materials 12 and 16, or may be a different composition than one or both of electrode materials 12 and 16.

Referring to FIGS. 6-6C, the third electrode material 34 and programmable material 32 are patterned into diagonal lines 36-42. Such diagonal lines cross the first lines 20-23 (FIG. 5B). The diagonal lines 36-42 extend along a diagonal direction corresponding to an illustrated axis 43. Such diagonal direction is between the directions of axis 5 and axis 7, and in some embodiments may be at about 45° relative to the axes 5 and 7. The diagonal lines are on a pitch $P_1$. In embodiments in which the diagonal lines extend at 45° relative to the first lines 20-23 (FIG. 4), the pitch $P_1$ may be about 0.7P (where P is the pitch of the first lines, as shown in FIG. 2B). In some embodiments, the first lines of FIGS. 2 and 2B (lines 20-23) may be on a different pitch than second lines described below with reference to FIGS. 10 and 10A (lines 56-59), and pitch $P_1$ may be any suitable pitch to achieve stable pillar structures (with example pillar structures being described below with reference to FIGS. 10-10D). Also, in some embodiments, the first lines of FIGS. 2 and 2B (lines 20-23) may be staggered amongst varying pitches rather than all being on the same pitch and/or the second lines of FIGS. 10 and 10A (lines 56-59) may be staggered amongst varying pitches rather than all being on the same pitch; and the diagonal lines 36-42 of FIGS. 6-6C may be staggered amongst varying pitches and/or otherwise may be configured in an appropriate pattern on any pitch or combination of pitches to achieve stable pillar structures.

The diagonal lines 36-42 may be formed with any suitable processing. For instance, a patterned mask (not shown) may be formed over material 34, a pattern may be transferred from the mask into underlying materials with one or more suitable etches, and then the mask may be removed to leave the construction of FIGS. 6-6C. The mask may be a lithographic mask (for instance, a photolithographically-patterned photoresist mask) or a sublithographic mask (for instance, a mask formed utilizing pitch-multiplication methodologies).

In the embodiment of FIGS. 6-6C, a pattern of diagonal lines 36-42 is transferred partially into stack 8 (FIGS. 5A and 5B), and specifically is transferred through the first and second electrode materials 12 and 16, and the select device materials 14. Such singulates the select device materials into a plurality of select devices 44 as shown along the view of FIG. 6C; and singulates the first and second electrode materials 12 and 16 into a plurality of first and second electrodes 46 and 48 (only some of which are labeled in the views of FIGS. 6A and 6B).

The pattern of diagonal lines 36-42 is also transferred through regions of insulative materials 28 and 30. Dashed lines 41 (only some of which are labeled) are provided in FIG. 6C to diagrammatically illustrate that first portions of materials 28 and 30 are raised relative to second portions at the processing stage of FIG. 6C due to the first portions having been incorporated into diagonal lines 36-42 during etching into materials 28 and 30.

Figure 7:
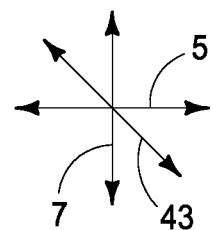
Figure 7:
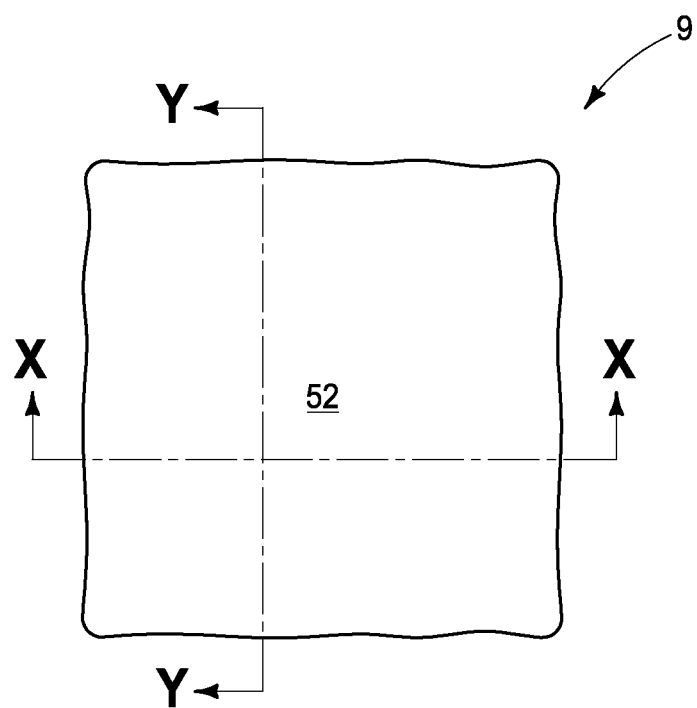

Referring next to FIGS. 7-7D, electrically insulative materials 50 and 52 are formed over and between lines 36-42 (FIG. 6). The insulative materials 50 and 52 may comprise identical compositions as the materials 28 and 30 described above with reference to FIGS. 3-3B. Accordingly, in some embodiments material 50 may comprise silicon nitride, and material 52 may comprise silicon dioxide. In other embodiments, one or both of materials 50 and 52 may be a different composition than one or both of materials 28 and 30, and in some embodiments materials 50 and 52 may be replaced with a single material, or may be replaced with more than two materials. In embodiments in which programmable material 32 comprises chalcogenide, it may be advantageous to protect such material from exposure to oxygen. Accordingly, it may be advantageous that material 50 be a non-oxygen-containing material.

Figure 8:
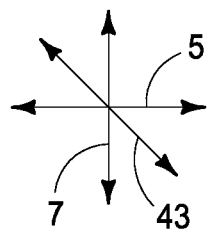
FIGS. 8-8C are a top view, cross-sectional side views, and a cross-sectional plan view of the semiconductor construction of FIGS. 1-1B at a processing stage subsequent to that of FIGS. 7-7D. The cross-sectional side views of FIGS. 8A and 8B are along the lines X-X and Y-Y of FIG. 8, respectively; and the cross-sectional plan view of FIG. 8C is along the lines 8C-8C of FIGS. 8A and 8B.
Figure 8:
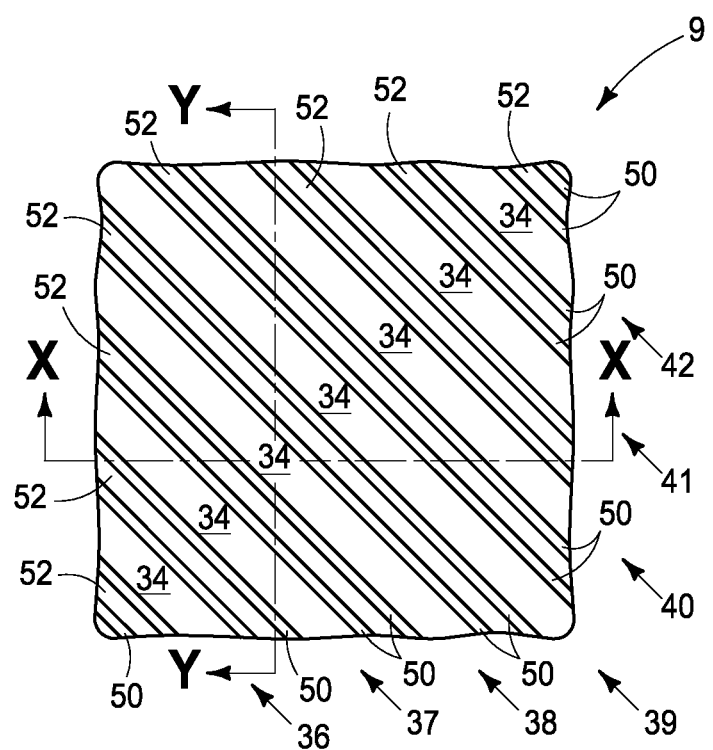
Figure 8B:
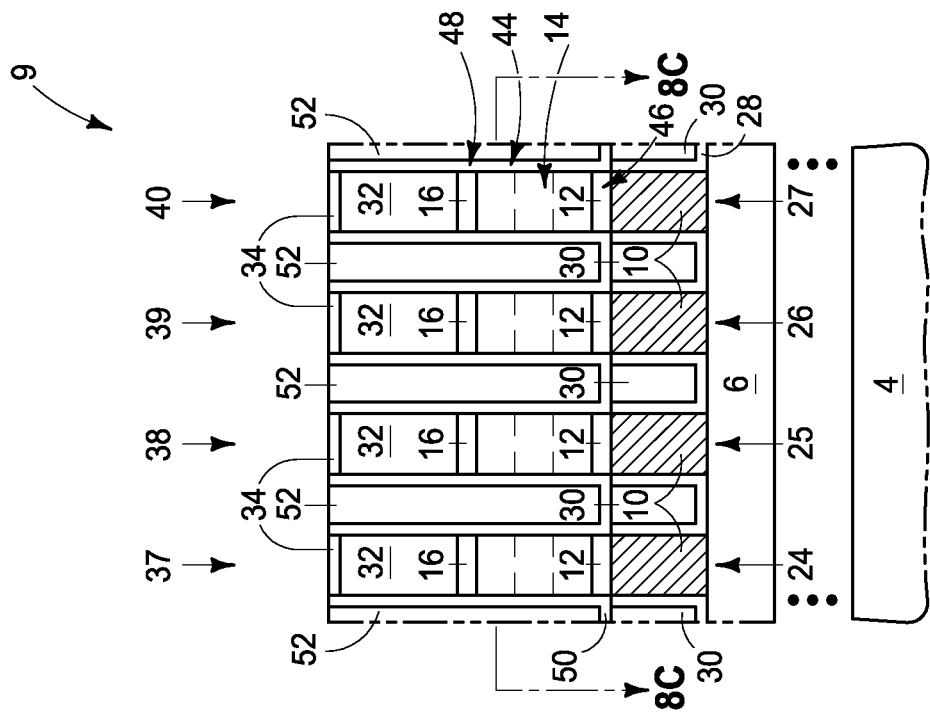
Figure 8A:
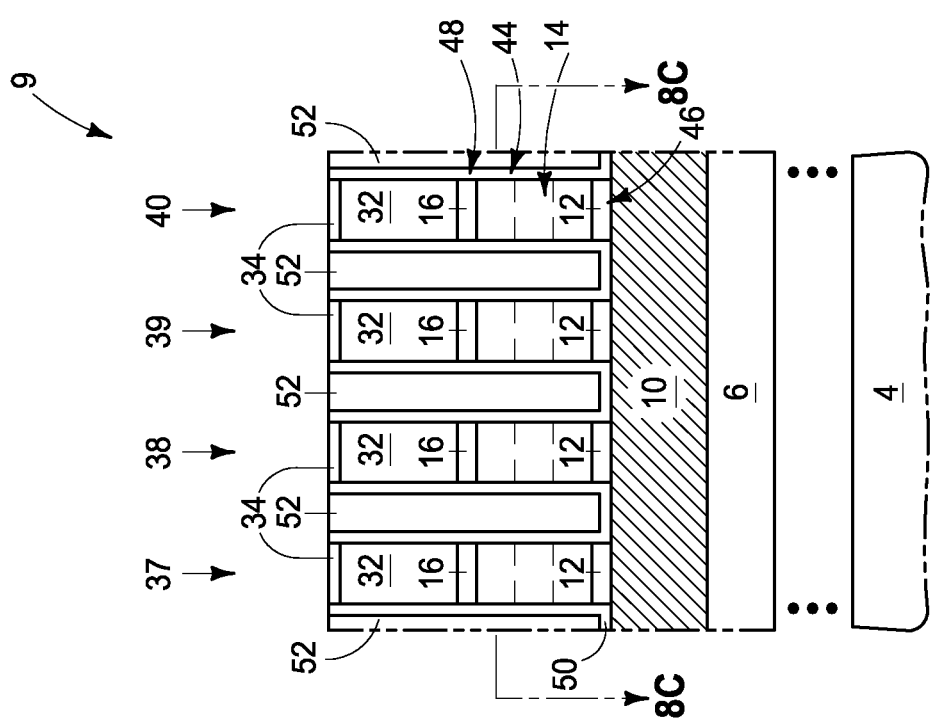
Figure 8C:
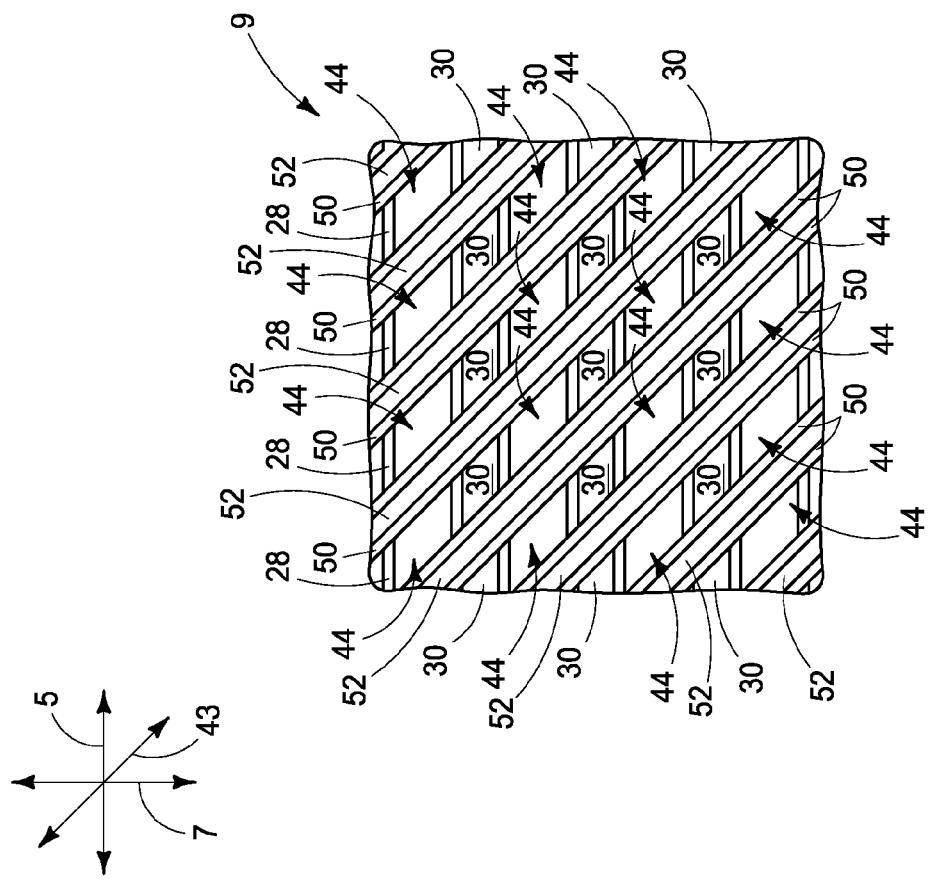

Referring to FIGS. 8-8C, the insulative materials 50 and 52 are removed from over lines 36-42, which exposes a surface of the third electrode material 34 at the tops of the lines. In some embodiments, the materials 50 and 52 may be removed utilizing planarization, such as, for example, chemical-mechanical polishing (CMP).

Figure 9:
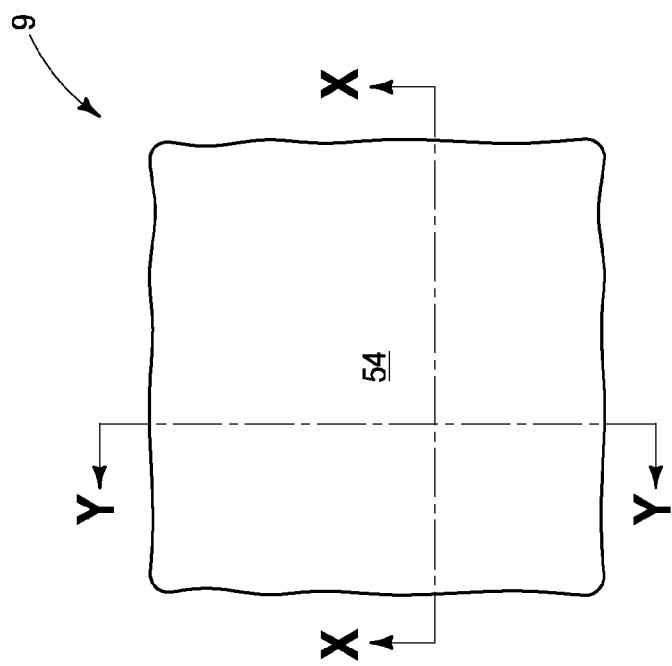

Referring to FIGS. 9-9D, access/sense material 54 is formed across lines 36-42; and in the shown embodiment is formed over and directly against the exposed upper surfaces of electrode material 34. In some embodiments, the access/sense material 54 may be referred to as a second access/sense material to distinguish it from the first access/sense material 10.

Figure 10:
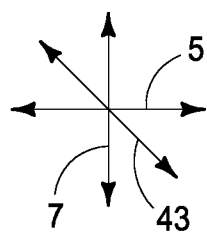
Figure 10:
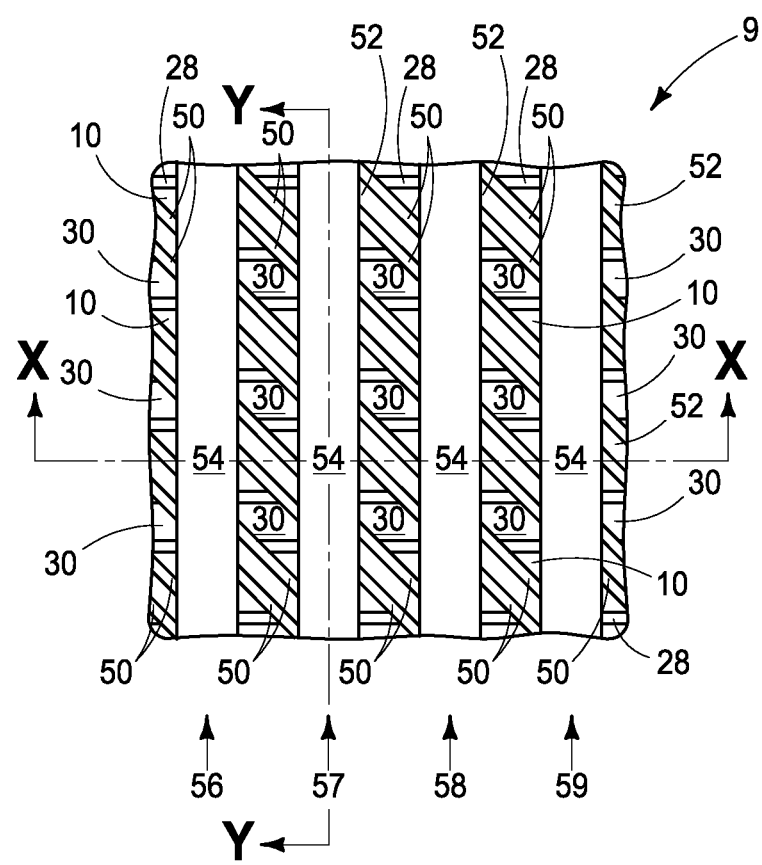

Referring to FIGS. 10-10D, access/sense material 54 is patterned into access/sense lines 56-59 extending along the direction of axis 7. Accordingly, the lines 56-59 may be substantially orthogonal to the lines 20-23 (FIGS. 2-2B); with the term "substantially orthogonal" meaning that the lines 56-59 are orthogonal to the lines 20-23 within reasonable tolerances of fabrication and measurement. The lines 56-59 are formed to be on the same pitch "P" as the lines 20-23 (FIGS. 2-2B) in the shown embodiment. In other embodiments the lines 56-59 may be on a different pitch than the lines 20-23.

The lines 56-59 may be formed with any suitable processing. For instance, a patterned mask (not shown) may be formed over material 54, a pattern may be transferred from the mask into the material 54 with one or more suitable etches, and then the mask may be removed to leave the construction of FIGS. 10-10D. The mask may be a lithographic mask (for instance, a photolithographically-patterned photoresist mask) or a sublithographic mask (for instance, a mask formed utilizing pitch-multiplication methodologies).

The access/sense lines 56-59 may be referred to as second access/sense lines to distinguish them from the first access/sense lines 24-27.

The pattern of lines 56-59 is transferred into the programmable material 32 and the third electrode material 34. Such singulates the programmable material into individual memory cells 60 (only some of which are labeled), and singulates the third electrode material 34 into electrodes 62 (only some of which are labeled).

The memory cells 60 form a memory array; with each memory cell being uniquely addressed through the combination of an access/sense line from the first series under the memory cells (i.e., the access/sense lines 24-27) and an access/sense line from the second series above the memory cells (i.e., the access/sense lines 56-59). In some embodiments, the access/sense lines 24-27 may correspond to wordlines, and the access/sense lines 56-59 may correspond to bitlines.

The access/sense lines 26 and 57 are diagrammatically illustrated in FIG. 10D. The lines are shown in dashed-line view to indicate that the lines 26 and 57 are below and above the plane of FIG. 10D, respectively. The access/sense line 26 has sidewalls 71 extending along the first direction of axis 5, and the access/sense line 57 has sidewalls 73 extending along the second direction of axis 7. The memory cells 60 are polygonal structures, and in the shown embodiment are substantially parallelepiped structures (with the term "substantially" meaning that the structures are parallelepiped to within reasonable tolerances of fabrication and measurement). The memory cells have a first pair of opposing sidewalls 75 which are substantially identical to one another and parallel to the sidewalls 73 of access/sense line 57, and have a second pair of opposing sidewalls 77 which are substantially identical to one another and which extend along a direction which is different than the first and second directions of axes 5 and 7. In the shown embodiment, the sidewalls 77 are the longest sidewalls of the parallelepiped memory cell structures 60.

The access/sense lines 26 and 57 are also diagrammatically illustrated in FIG. 10C. The select devices 44 are illustrated as polygonal structures, and in the shown embodiment are substantially parallelepiped structures having a different shape than the polygonal structures of the memory cells 60. The select devices 44 have a first pair of opposing sidewalls 81 which are substantially identical to one another and parallel to the sidewalls 71 of access/sense line 26, and have a second pair of opposing sidewalls 83 which are substantially identical to one another and which extend along a direction which is different than the first and second directions of axes 5 and 7.

The select devices 44 and memory cells 60 are part of pillars 64 (shown in FIGS. 10A and 10B) extending between the access/sense lines 24-27 of the first series and the access/sense lines 56-59 of the second series. The utilization of multiple different polygonal peripheral shapes for different regions of the pillars may enable the pillars to have enhanced structural integrity as compared to conventional pillars. Such enhanced structural integrity may enable programmable material 32 to be provided to an increased thickness, as discussed above; and/or may provide other benefits, including benefits mentioned above in describing FIGS. 5-5B.

Figure 11:
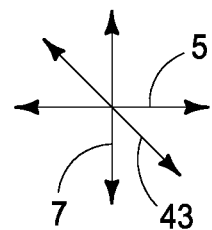
FIGS. 11-11D are a top view, cross-sectional side views, and cross-sectional plan views of the semiconductor construction of FIGS. 1-1B at a processing stage subsequent to that of FIGS. 10-10D. The cross-sectional side views of FIGS. 11A and 11B are along the lines X-X and Y-Y of FIG. 11, respectively; and the cross-sectional plan views of FIGS. 11C and 11D are along the lines 11C-11C and 11D-11D of FIGS. 11A and 11B.
Figure 11:
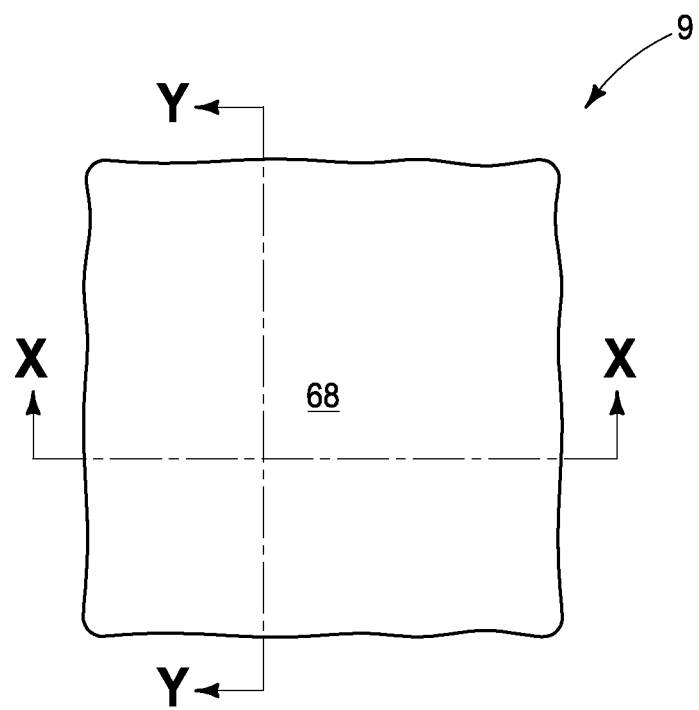
Figure 11A:
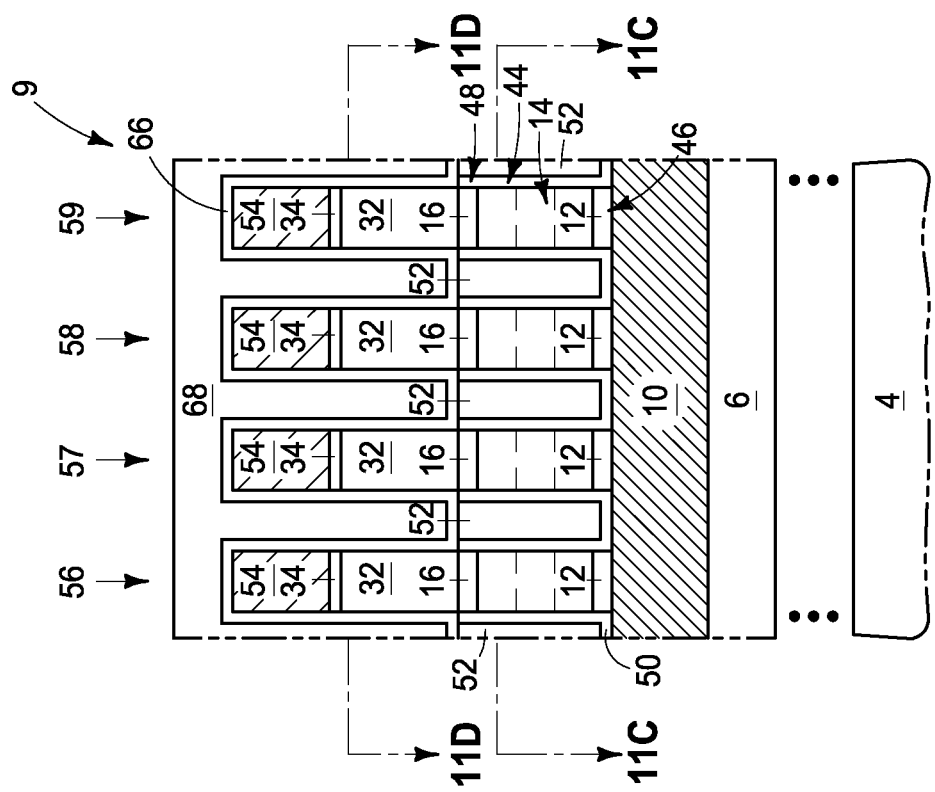
Figure 11B:
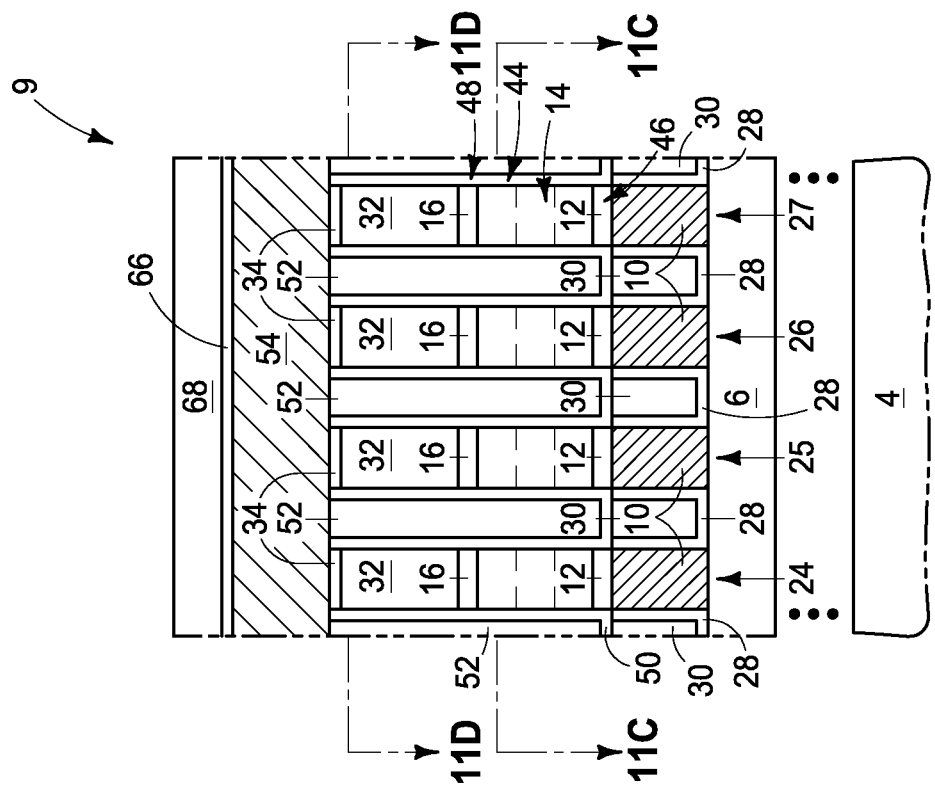
Figure 11D:
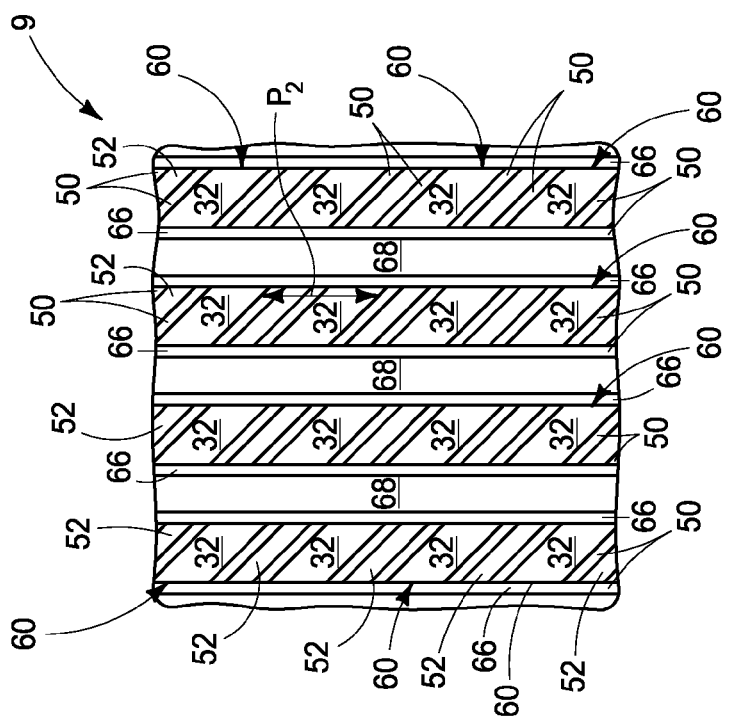
Figure 11C:
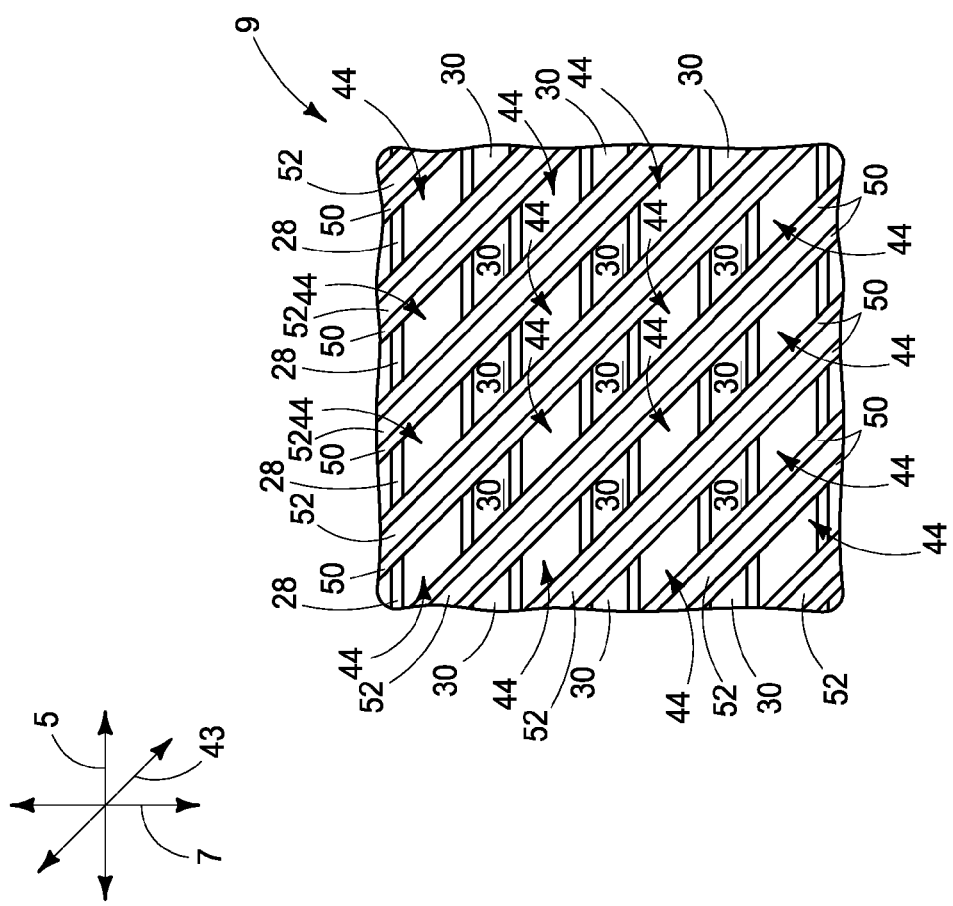

Referring next to FIGS. 11-11D, electrically insulative materials 66 and 68 are formed over and between lines 56-59. The insulative materials 66 and 68 may comprise identical compositions as the materials 28 and 30 described above with reference to FIGS. 3-3B. Accordingly, in some embodiments material 66 may comprise silicon nitride, and material 68 may comprise silicon dioxide. In other embodiments, one or both of materials 66 and 68 may be a different composition than one or both of materials 28 and 30. In some embodiments materials 66 and 68 may be replaced with a single material, or may be replaced with more than two materials.

FIG. 11D shows memory cells 60 on a pitch $P_2$. In some embodiments, such pitch may be less than or equal to about 40 nanometers, less than or equal to about 30 nanometers, etc. In some embodiments, the pitch $P_2$ may be within a range of from about 10 nanometers to about 40 nanometers; and in some embodiments may be within a range of from about 10 nanometers to about 30 nanometers.

The embodiment of FIGS. 1-11 forms memory cells 60 which are configured such that all of the programmable material within the memory cells is configured as one polygonal structure. In other embodiments, the programmable material may be subdivided into two or more regions which are different polygonal shapes relative to one another. An example embodiment process for fabricating the programmable material to comprise two differently-shaped regions is described with reference to FIGS. 12-22.

Figure 12:
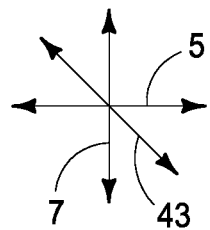
Figure 12:
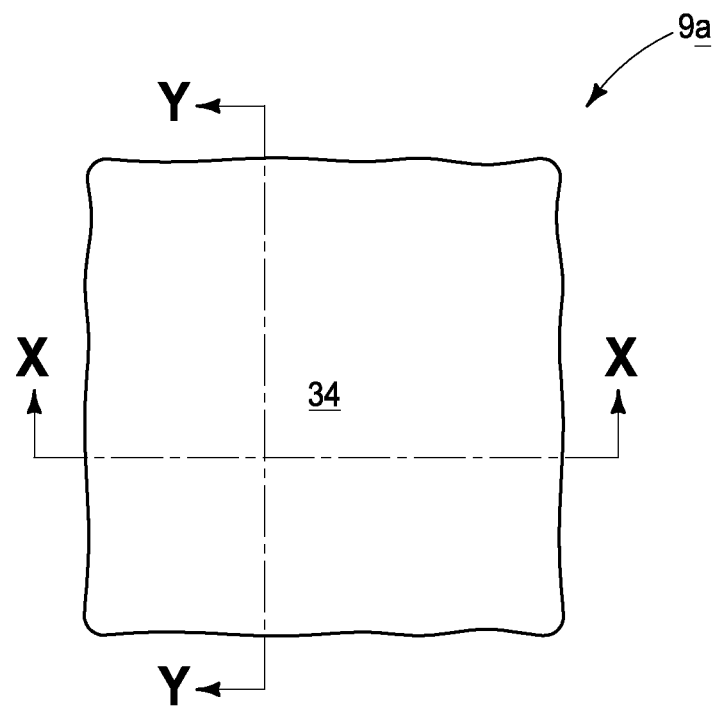

Referring to FIGS. 12-12B, a portion of a construction 9*a* is illustrated. The construction comprises semiconductor base 4, electrically insulative material 6; and a stack 70 formed over the insulative material 6. Stack 70 includes access/sense material 10, first electrode material 12, one or more select device materials 14, second electrode material 16, first programmable material 32a and third electrode material 34.

The materials 10, 12, 14, 16 and 34 may be the same as those discussed above with reference to FIGS. 1-5. The programmable material 32a may comprise any of the materials described above with reference to material 32 of FIG. 5; and in some embodiments may comprise phase change material, such as chalcogenide (for instance, GST). The programmable material 32a may be referred to as a first region of programmable material in some embodiments.

Figure 13:
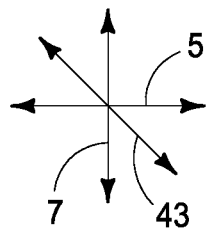
FIGS. 13-13B are a top view and cross-sectional side views of the semiconductor construction of FIGS. 12-12B at a processing stage subsequent to that of FIGS. 12-12B. The views of FIGS. 13A and 13B are along the lines X-X and Y-Y of FIG. 13, respectively.
Figure 13:
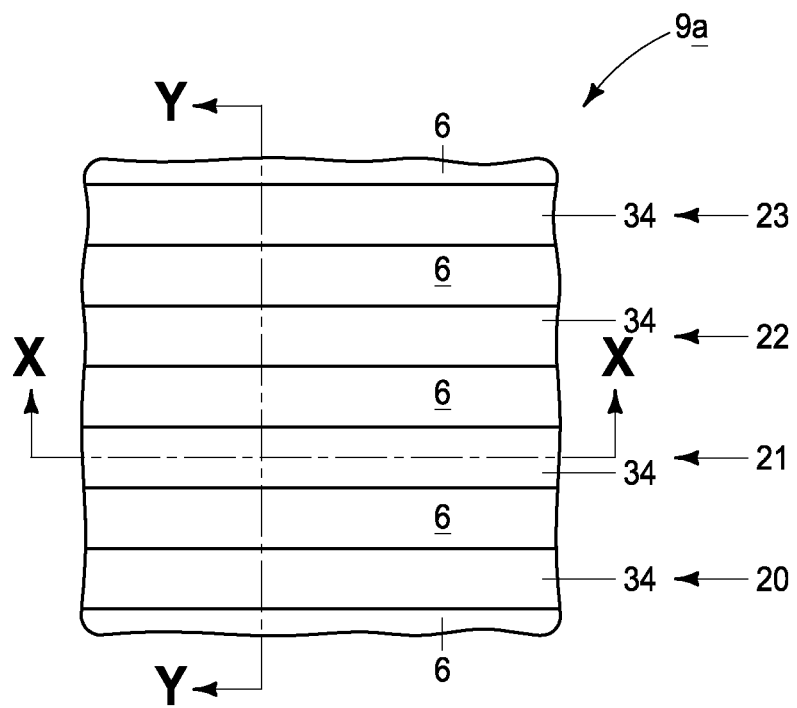
Figure 13B:
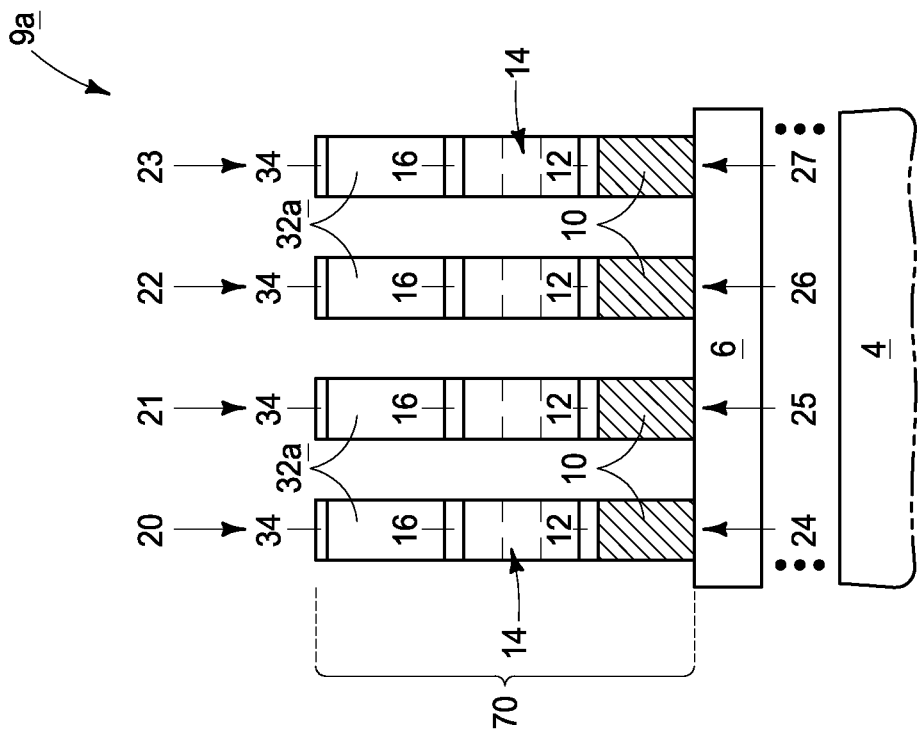
Figure 13A:
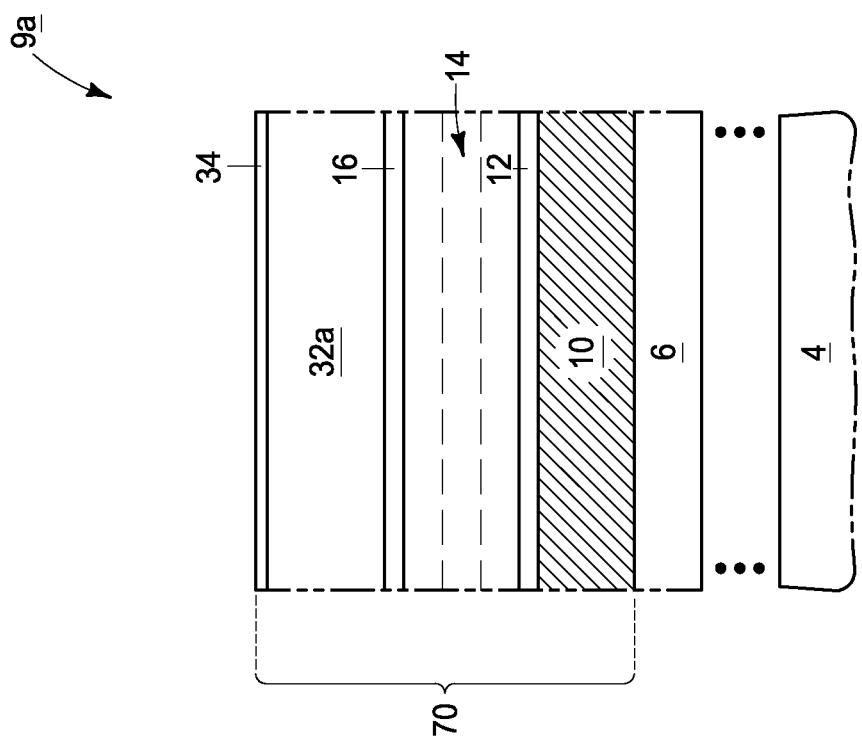

Referring to FIGS. 13-13B, stack 70 is patterned into lines 20-23 extending along the first direction of axis 5. The patterned access/sense material 10 forms the first series of access/sense lines 24-27.

Figure 14:
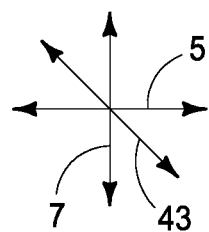
FIGS. 14-14B are a top view and cross-sectional side views of the semiconductor construction of FIGS. 12-12B at a processing stage subsequent to that of FIGS. 13-13B. The views of FIGS. 14A and 14B are along the lines X-X and Y-Y of FIG. 14, respectively.
Figure 14:
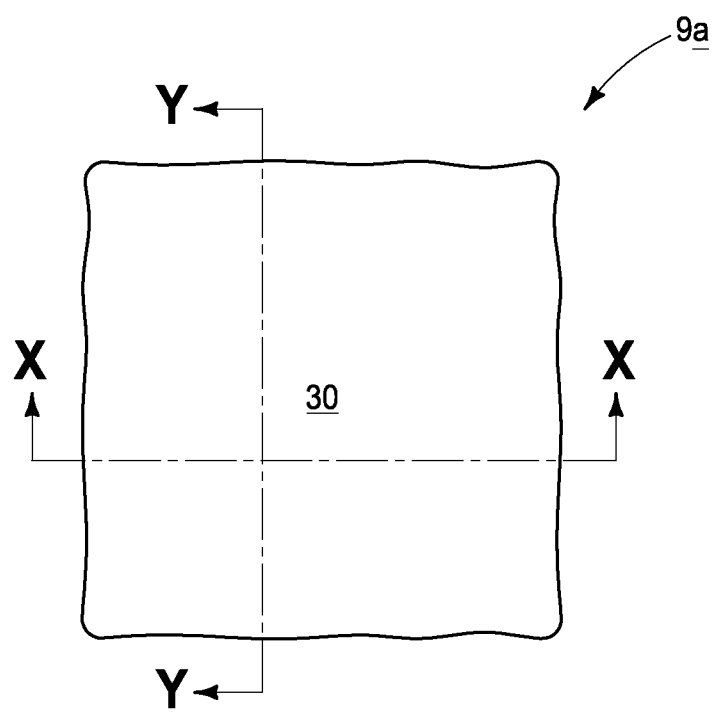
Figure 14B:
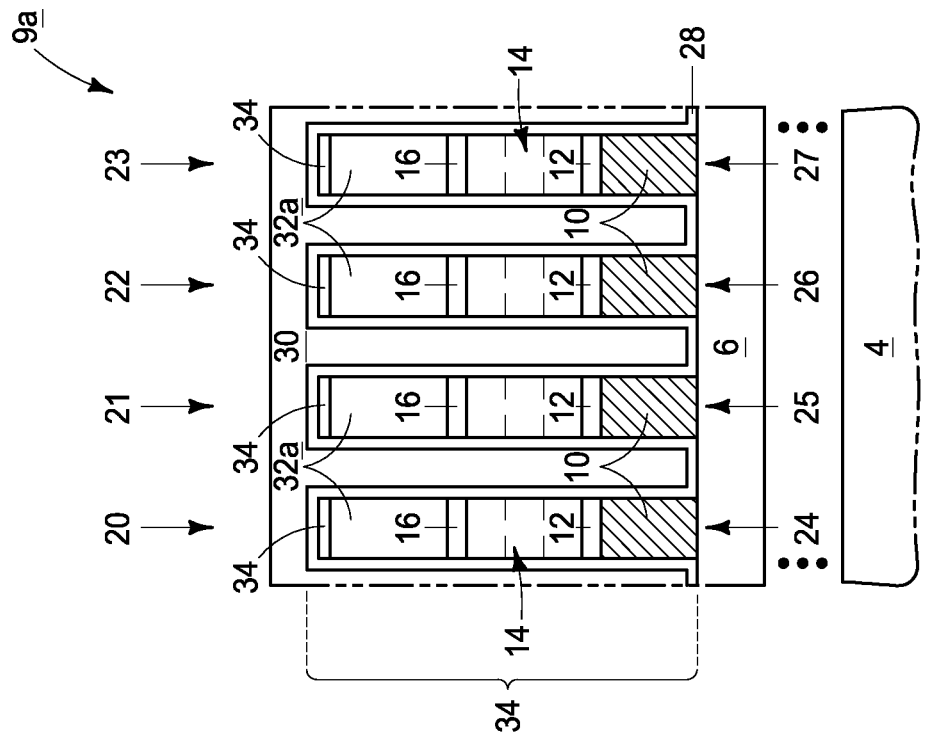
Figure 14A:
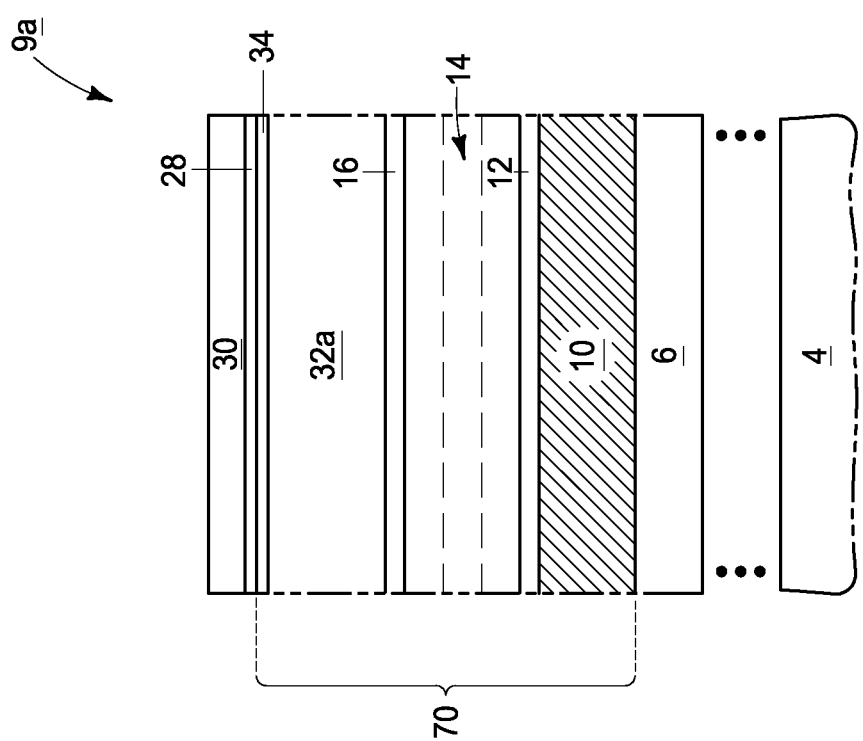

Referring to FIGS. 14-14B, insulative materials 28 and 30 are formed over and between the lines 20-23.

Figure 15:
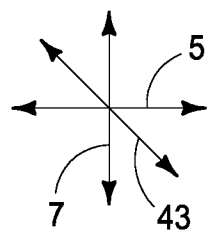
FIGS. 15-15B are a top view and cross-sectional side views of the semiconductor construction of FIGS. 12-12B at a processing stage subsequent to that of FIGS. 14-14B. The views of FIGS. 15A and 15B are along the lines X-X and Y-Y of FIG. 15, respectively.
Figure 15:
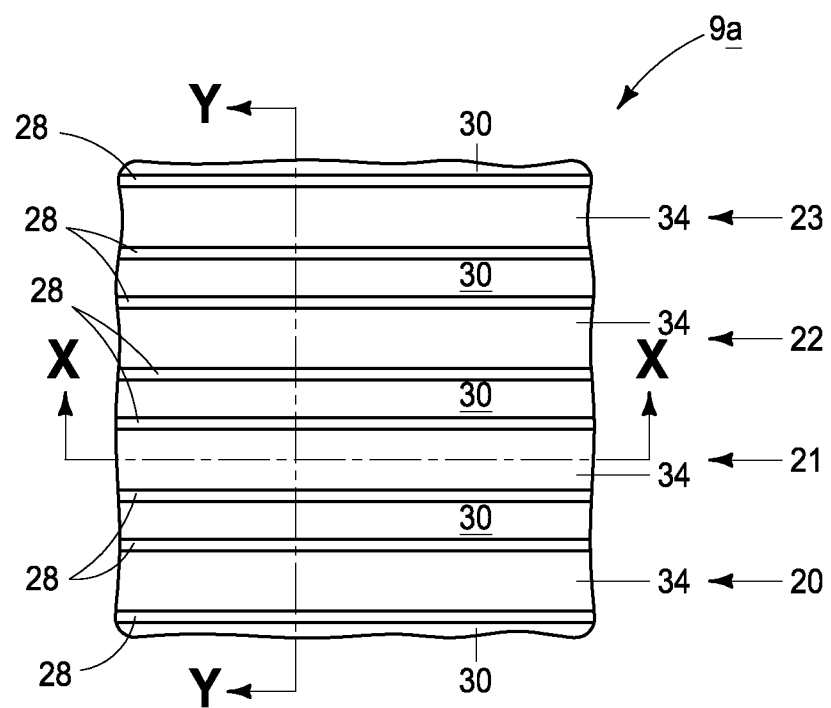
Figure 15B:
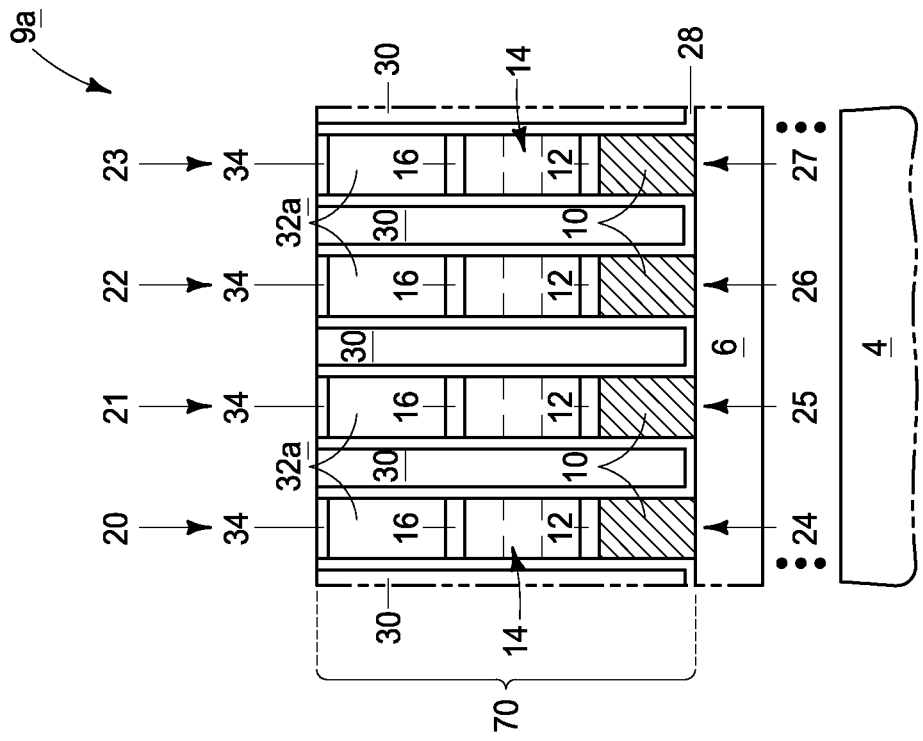
Figure 15A:
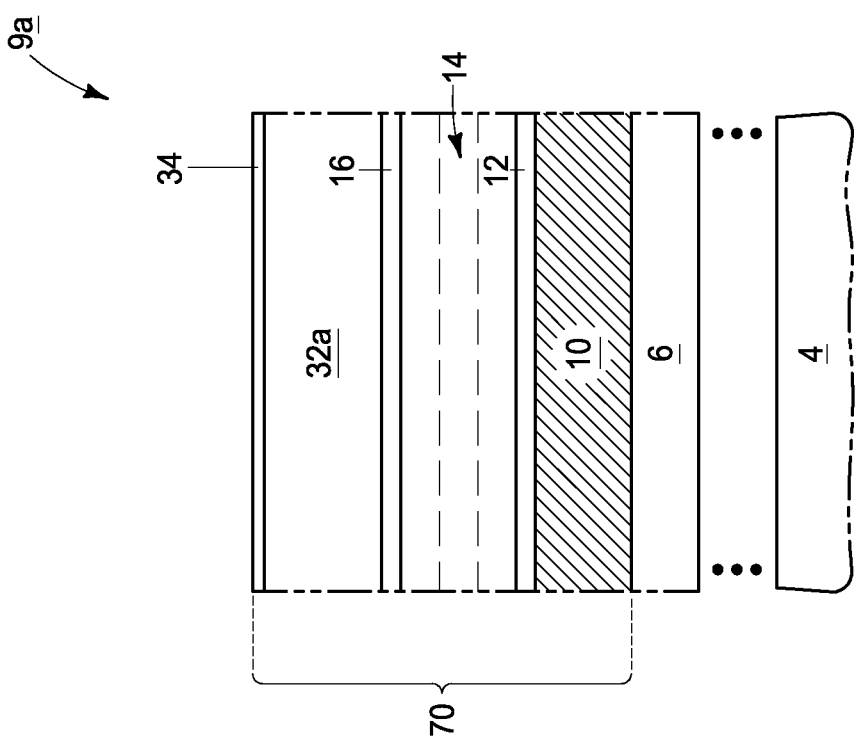

Referring to FIGS. 15-15B, the insulative materials 28 and 30 are removed from over lines 20-23, which exposes a surface of the third electrode material 34 at the tops of the lines. In some embodiments, the materials 28 and 30 may be removed utilizing planarization, such as, for example, chemical-mechanical polishing (CMP).

Figure 16:
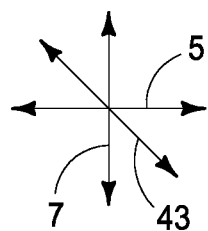
Figure 16:
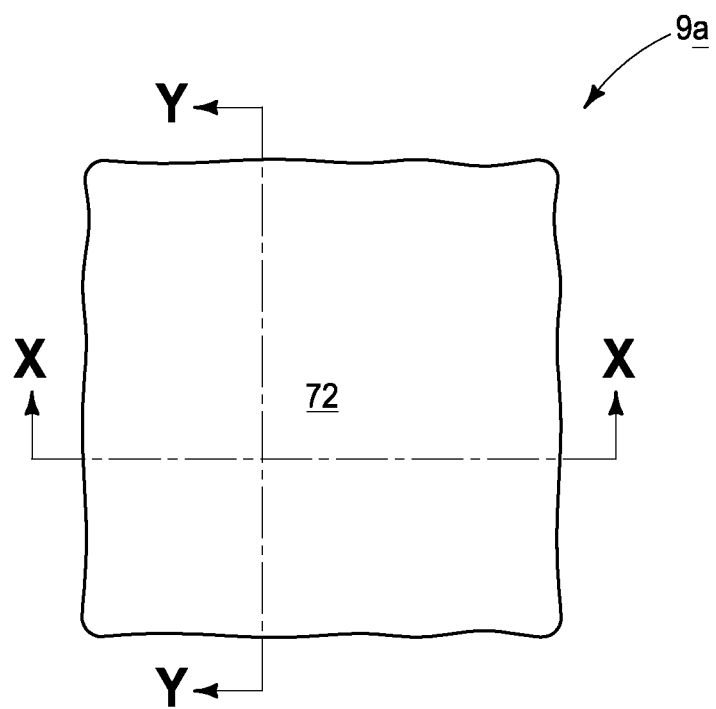

Referring to FIGS. 16-16B, second programmable material 32b is formed across lines 20-23; and in the shown embodiment is formed over and directly against the exposed upper surfaces of third electrode material 34. The programmable material 32b may comprise any of the materials described above with reference to material 32 of FIG. 5; and in some embodiments may comprise phase change material, such as chalcogenide (for instance, GST). The programmable material 32b may be referred to as a second region of programmable material to distinguish it from the first region of programmable material corresponding to material 32a. In some embodiments, the programmable materials 32a and 32b may be a same composition as one another, and in other embodiments may be different compositions relative to one another.

A fourth electrode material 72 is formed over programmable material 32b. The fourth electrode material may comprise any of the compositions discussed above regarding electrode materials 12, 16 and 34; and in some embodiments may be a carbon-containing material.

Figure 17:
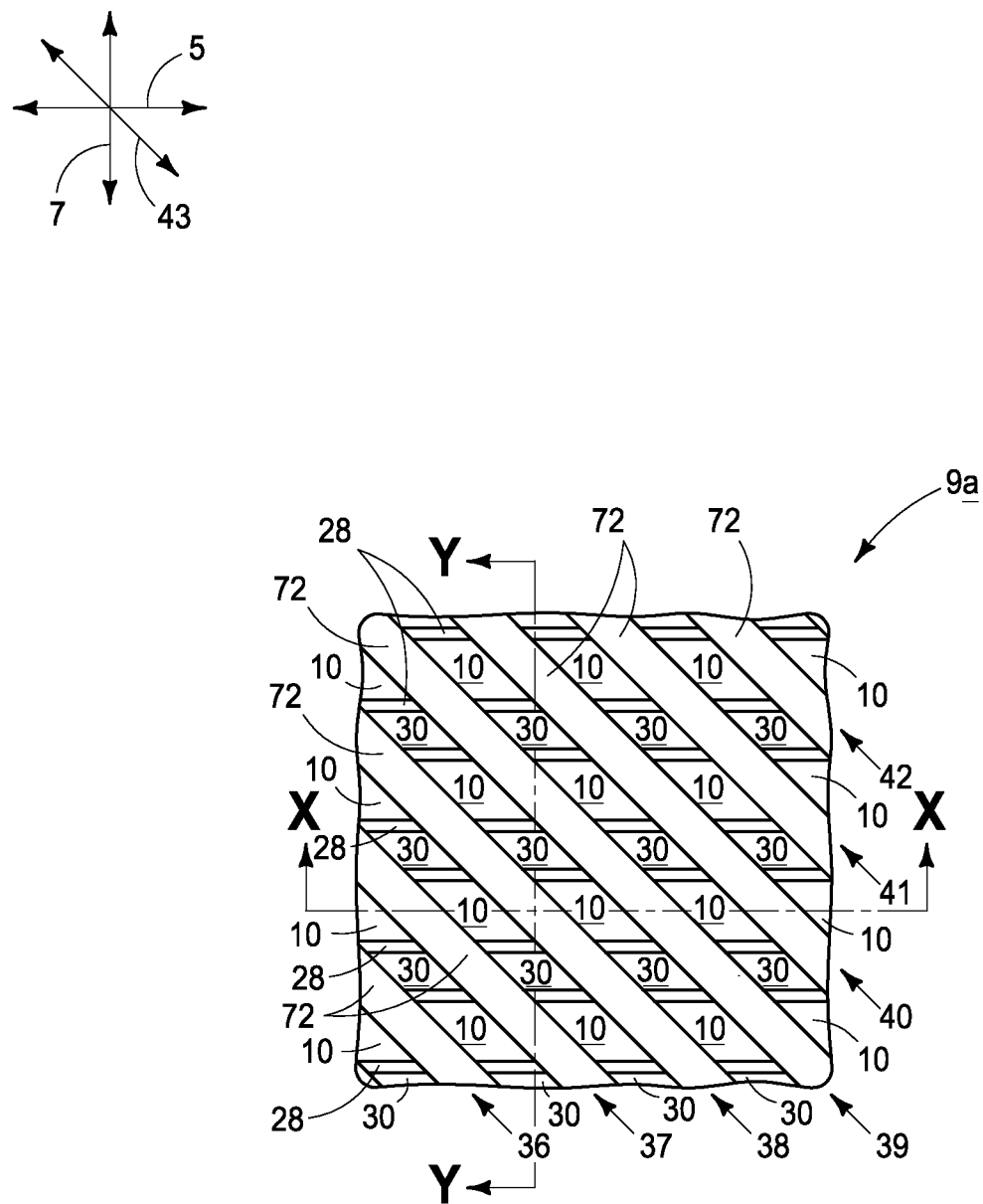

Referring to FIGS. 17-17B, the fourth electrode material 72 and programmable material 32b are patterned into the diagonal lines 36-42 extending along the diagonal direction of axis 43.

The diagonal lines 36-42 may be formed with any suitable processing. For instance, a patterned mask (not shown) may be formed over material 72, a pattern may be transferred from the mask into underlying materials with one or more suitable etches, and then the mask may be removed to leave the construction of FIGS. 17-17B. The mask may be a lithographic mask (for instance, a photolithographically-patterned photoresist mask) or a sublithographic mask (for instance, a mask formed utilizing pitch-multiplication methodologies).

In the shown embodiment, a pattern of diagonal lines 36-42 is transferred partially into stack 70 (FIGS. 16A and 16B), and specifically is transferred through the programmable material 32a; the first, second and third electrode materials 12, 16 and 34; and the select device materials 14. Such singulates the select device materials into a plurality of select devices 44 (only some of which are labeled), singulates the first, second and third electrode materials 12, 16 and 34 into a plurality of first, second and third electrodes 46, 48 and 74 (only some of which are labeled); and singulates first programmable material 32a into first memory cell structures 60a (only some of which are labeled). The first memory cell structures are configured as first polygonal structures having a first peripheral shape (specifically, a first parallelepipedal shape in some embodiments), as is discussed in more detail below with reference to FIG. 22E.

Figure 18:
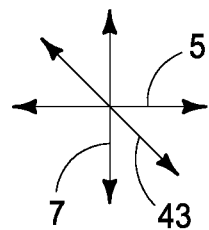
FIGS. 18-18C are a top view, cross-sectional side views, and a cross-sectional plan view of the semiconductor construction of FIGS. 12-12B at a processing stage subsequent to that of FIGS. 17-17B. The cross-sectional side views of FIGS. 18A and 18B are along the lines X-X and Y-Y of FIG. 18, respectively; and the cross-sectional plan view of FIG. 18C is along the lines 18C-18C of FIGS. 18A and 18B.
Figure 18:
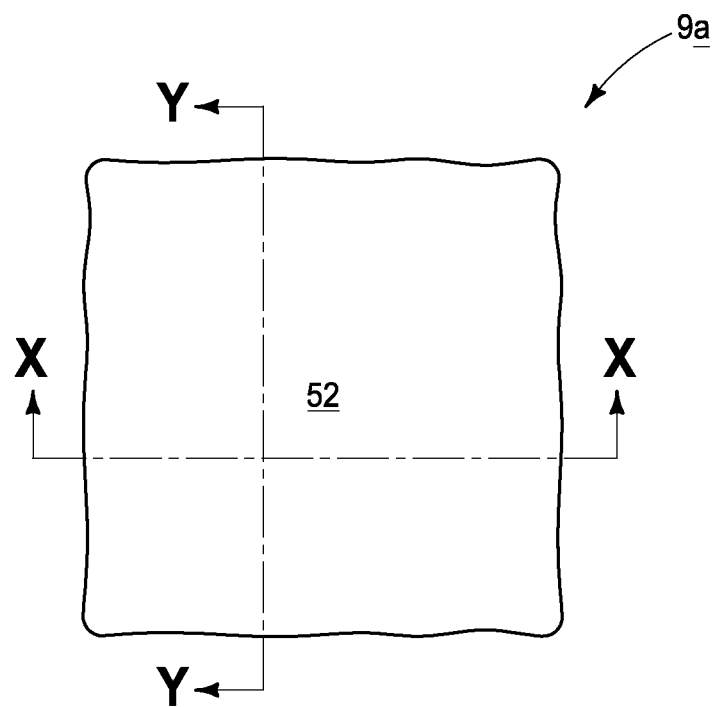
Figure 18C:
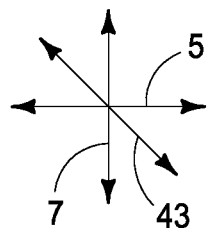
Figure 18C:
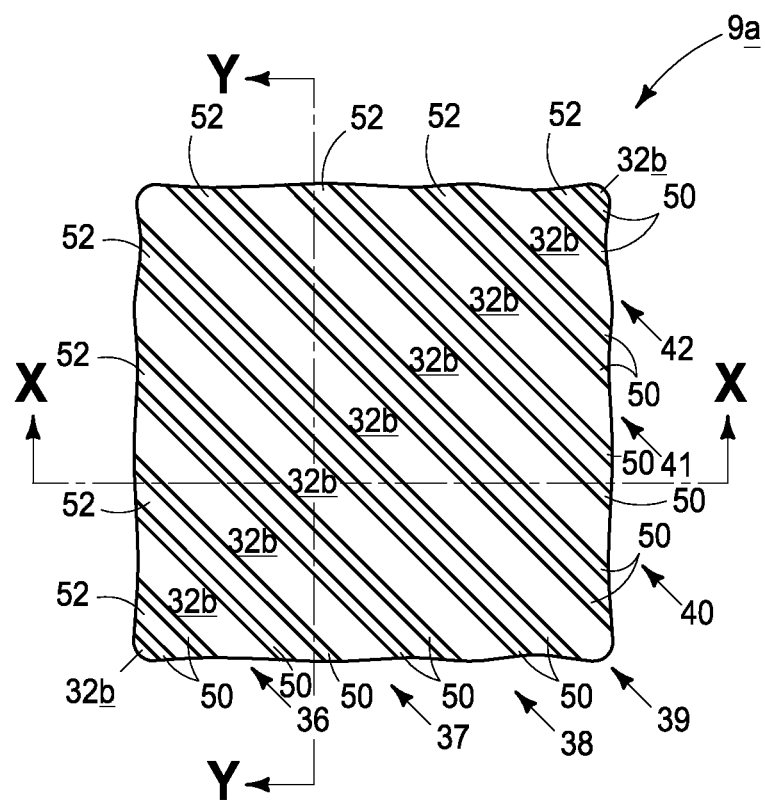

Referring next to FIGS. 18-18C, electrically insulative materials 50 and 52 are formed over and between lines 36-42 (FIG. 17).

Figure 19:
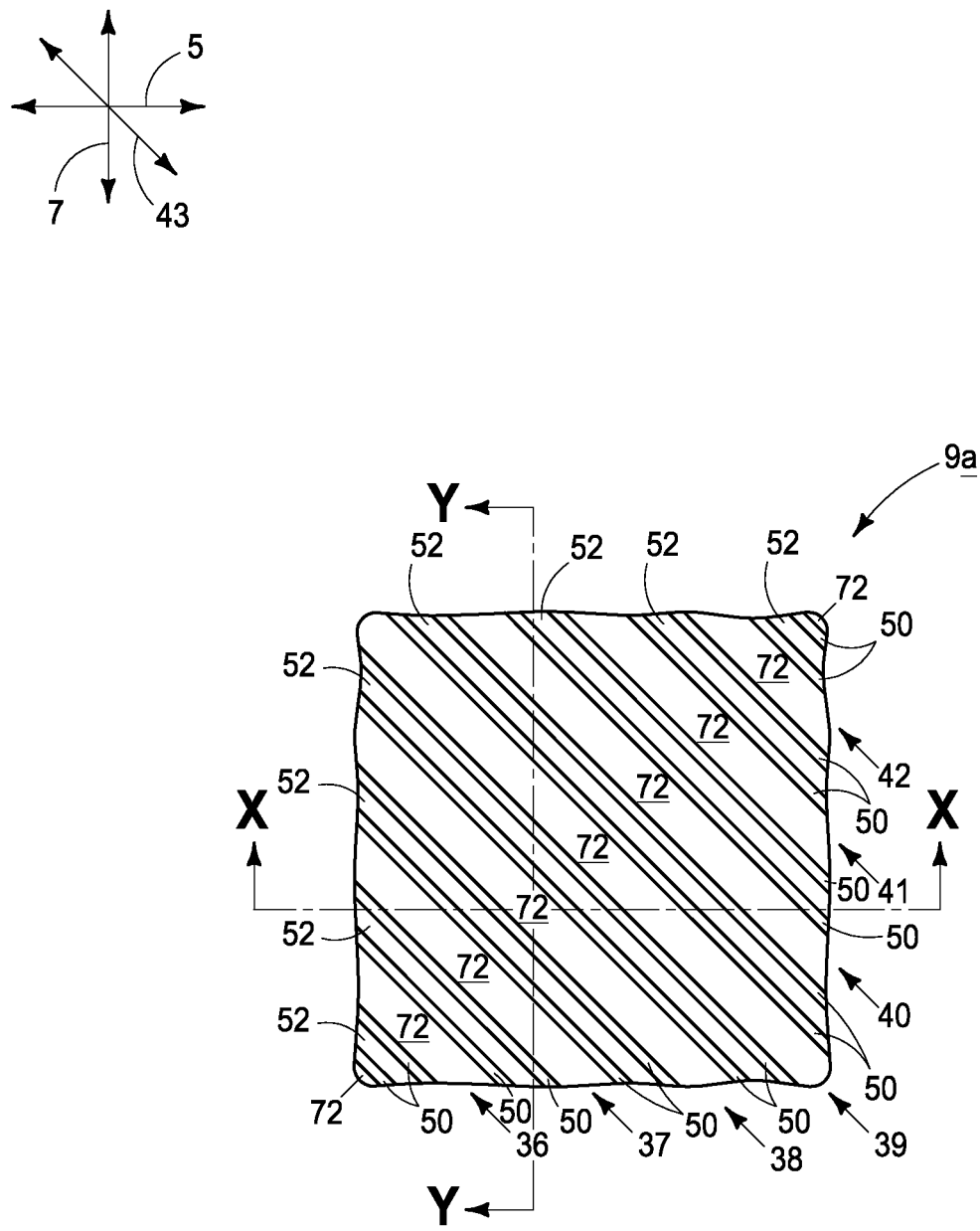

Referring to FIGS. 19-19B, the insulative materials 50 and 52 are removed from over lines 36-42, which exposes a surface of the fourth electrode material 72 at the tops of the lines. In some embodiments, the materials 50 and 52 may be removed utilizing planarization, such as, for example, chemical-mechanical polishing (CMP).

Figure 20:
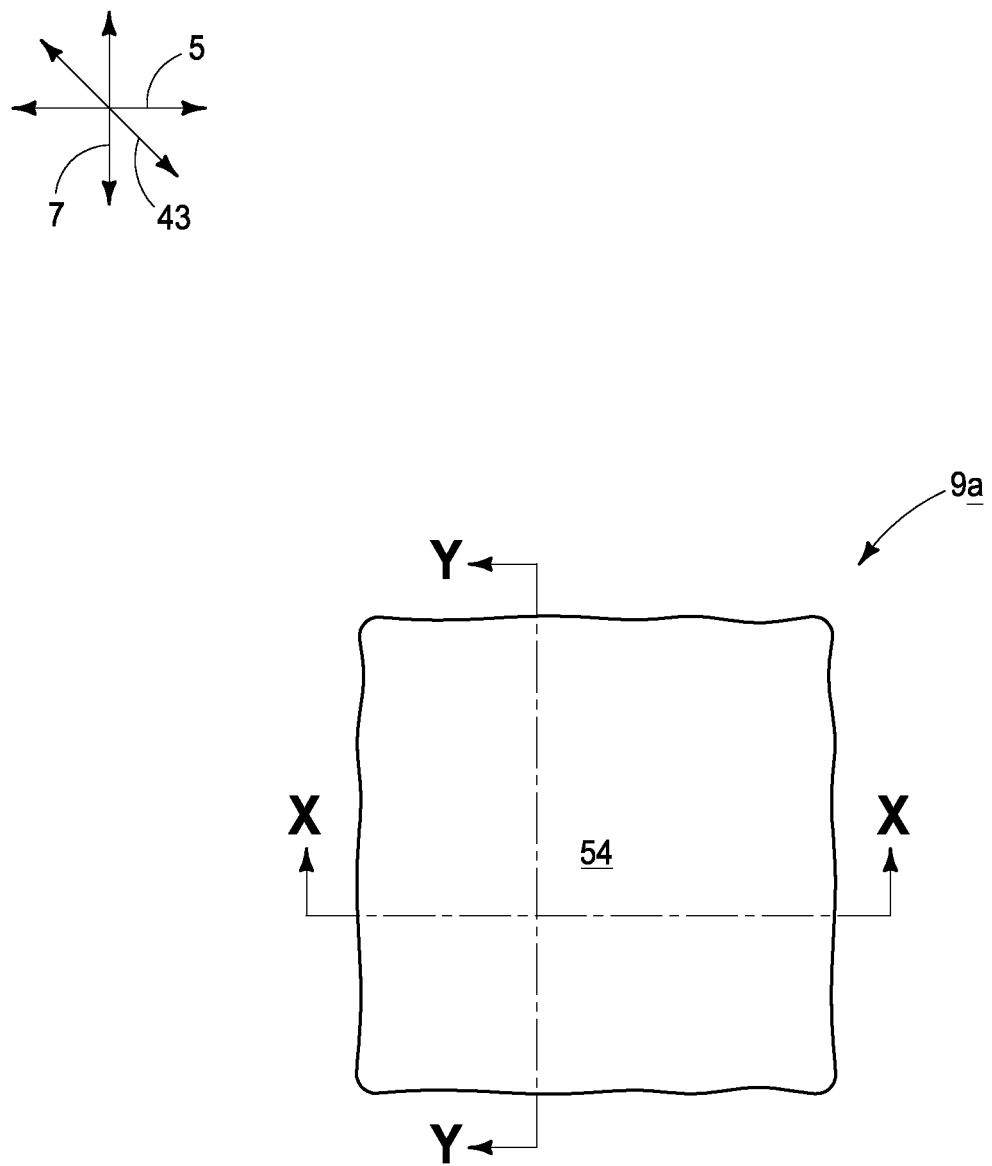
FIGS. 20-20C are a top view, cross-sectional side views, and a cross-sectional plan view of the semiconductor construction of FIGS. 12-12B at a processing stage subsequent to that of FIGS. 19-19B. The cross-sectional side views of FIGS. 20A and 20B are along the lines X-X and Y-Y of FIG. 20, respectively; and the cross-sectional plan view of FIG. 20C is along the lines 20C-20C of FIGS. 20A and 20B.
Figure 20C:
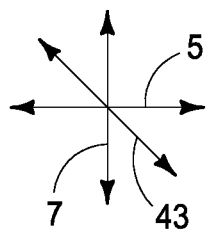
Figure 20C:
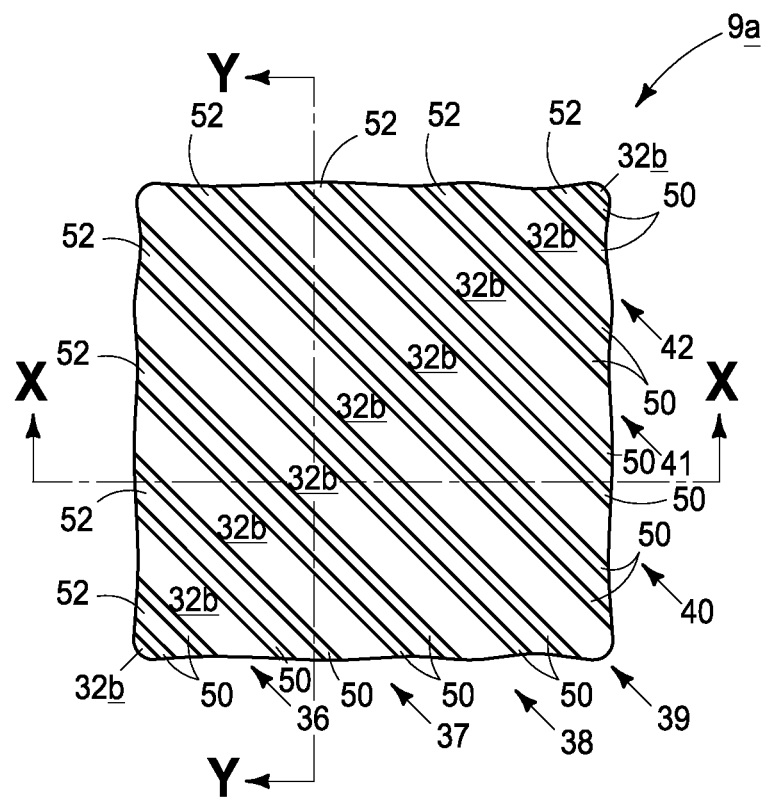

Referring to FIGS. 20-20C, the second access/sense material 54 is formed across lines 36-42; and in the shown embodiment is formed over and directly against the exposed upper surfaces of electrode material 72.

Figure 21:
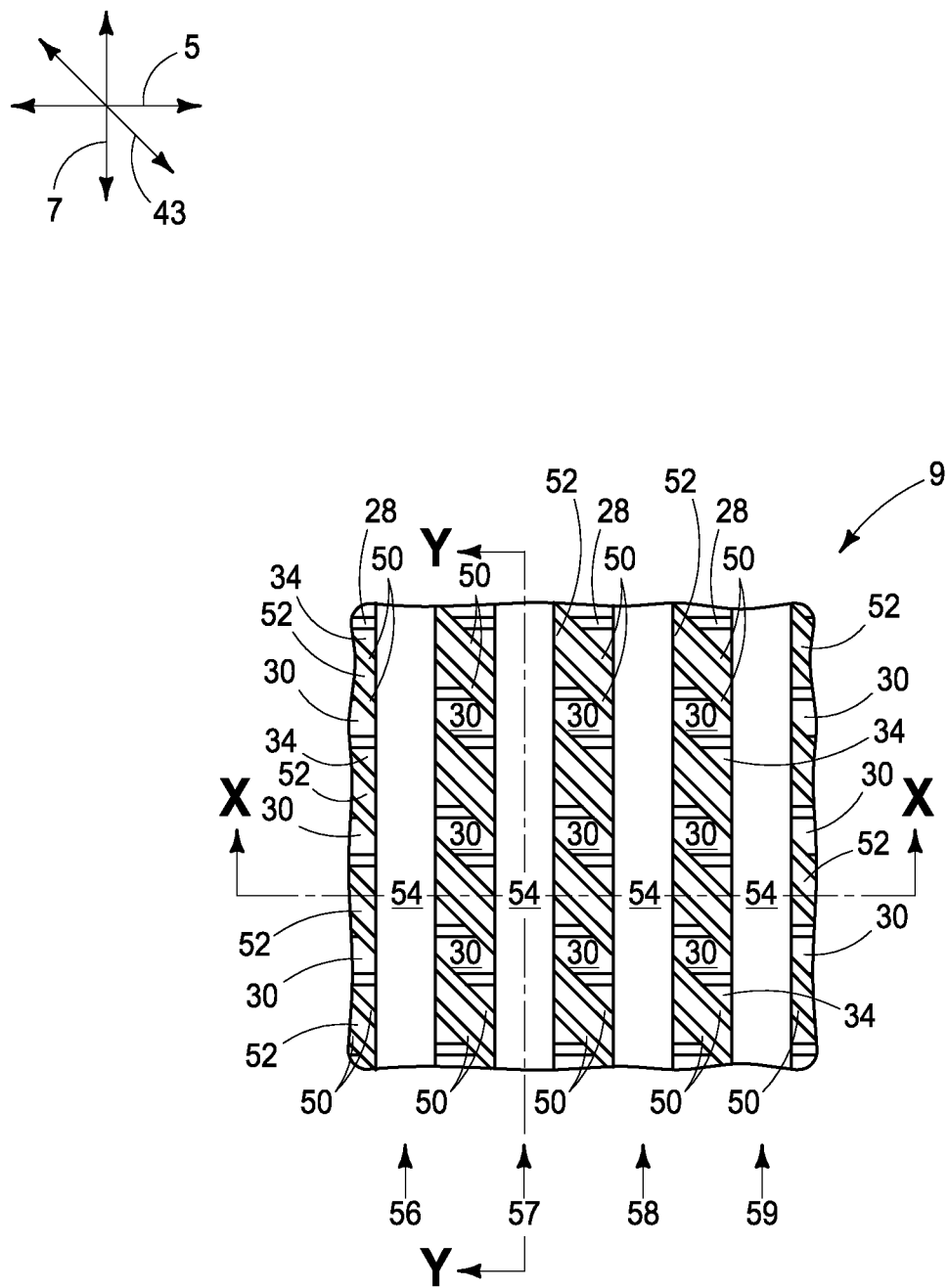
FIGS. 21-21C are a top view, cross-sectional side views, and a cross-sectional plan view of the semiconductor construction of FIGS. 12-12B at a processing stage subsequent to that of FIGS. 20-20C. The cross-sectional side views of FIGS. 21A and 21B are along the lines X-X and Y-Y of FIG. 21, respectively; and the cross-sectional plan view of FIG. 21C is along the lines 21C-21C of FIGS. 21A and 21B.
Figure 21C:
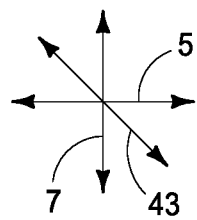
Figure 21C:
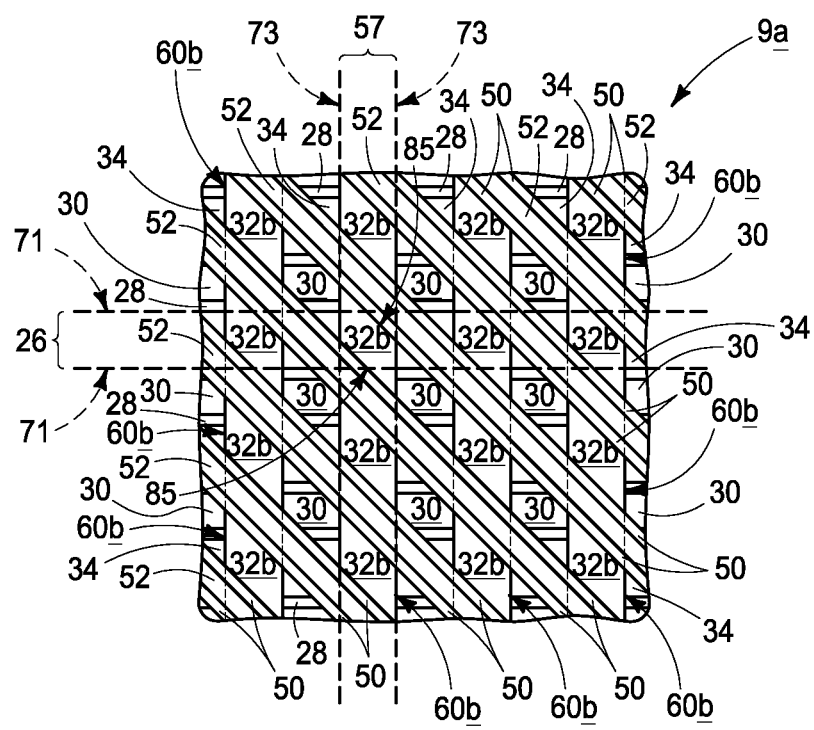

Referring to FIGS. 21-21C, access/sense material 54 is patterned into the second series of access/sense lines 56-59 extending along the direction of axis 7. The pattern of lines 56-59 is transferred into the programmable material 32b and the fourth electrode material 72. Such singulates the programmable material 32b into individual memory cell structures 60b (only some of which are labeled), and singulates the fourth electrode material 72 into electrodes 78 (only some of which are labeled).

The memory cell structures 60a and 60b are spaced from one another by separating material 34. The structures 60a and 60b, together with material 34, form memory cells 80 of a memory array. The structures 60a and 60b may be considered to be first and second portions of the programmable material of the memory cells 80. The material 34 may be kept very thin so that electrical properties of memory cells 80 are primarily dictated by the first and second portions corresponding to structures 60a and 60b; and in some embodiments the separating material 34 may have a vertical thickness of less than or equal to about 30 nm (such as, for example, a vertical thickness within a range of from about 5 nm to about 30).

In some embodiments, separating material 34 is utilized as an etch stop for the planarization of FIG. 15. Although separating material 34 is shown remaining in memory cells 80, in other embodiments material 34 may be entirely removed during or after the planarization of FIG. 15 so that memory cell structures 60a and 60b directly contact one another; or material 34 may be omitted so that memory cell structures 60a and 60b directly contact one another.

Each memory cell 80 is uniquely addressed through the combination of an access/sense line from the first series under the memory cells (i.e., the access/sense lines 24-27) and an access/sense line from the second series above the memory cells (i.e., the access/sense lines 56-59). In some embodiments, the access/sense lines 24-27 may correspond to wordlines, and the access/sense lines 56-59 may correspond to bitlines.

The access/sense lines 26 and 57 are diagrammatically illustrated in FIG. 21C. The structures 60b are polygonal structures analogous to the structures 60 of FIG. 10D, and in the shown embodiment are substantially parallelepiped structures having a pair of opposing sidewalls 85 which are substantially identical to one another and which extend along a direction different from the first and second directions of axes 5 and 7.

Figure 22:
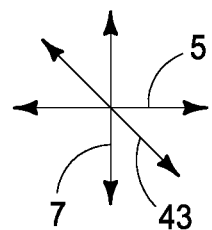
FIGS. 22-22E are a top view, cross-sectional side views, and cross-sectional plan views of the semiconductor construction of FIGS. 12-12B at a processing stage subsequent to that of FIGS. 21-21C. The cross-sectional side views of FIGS. 22A and 22B are along the lines X-X and Y-Y of FIG. 22, respectively; and the cross-sectional plan views of FIGS. 22C, 22D and 22E are along the lines 22C-22C, 22D-22D and 22E-22E of FIGS. 22A and 22B.
Figure 22:
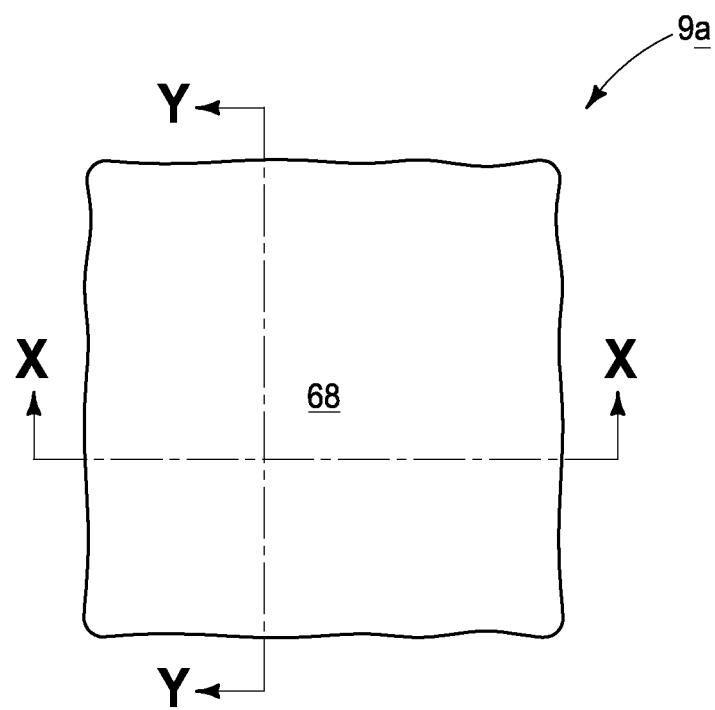
Figure 22E:
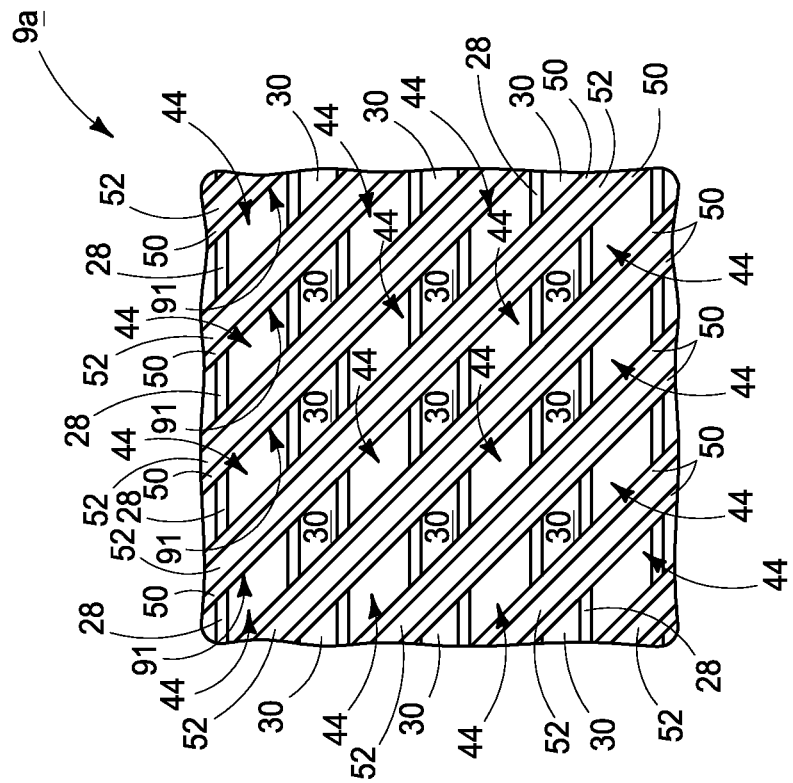
Figure 22E:
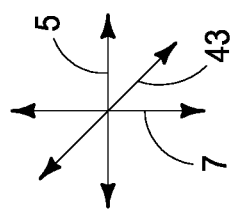

Referring next to FIGS. 22-22E, electrically insulative materials 66 and 68 are formed over and between lines 56-59.

FIGS. 22C-E show cross-sections plan views through second memory cell structures 60b, first memory cell structures 60a and select devices 44, respectively. Such plan views show that the first and second memory cell structures 60a and 60b are polygonal structures having different peripheral shapes relative to one another; and show that memory cell structures 60a have substantially identical peripheral shapes to select devices 44.

In some embodiments, structures 60a and 60b may be referred to as first and second polygonal structures, respectively; and may be considered to have first and second peripheral shapes which are different relative to one another.

The select device structures 44 have sidewalls parallel to sidewalls of the first polygonal structures 60a. Specifically, the select devices 44 have sidewalls 91 extending along the same axis 43 as the diagonal lines 36-42 of FIG. 17, and similarly the memory cell structures 60a have sidewalls 93 extending along axis 43. Such results from structures 44 and 60a having been singulated utilizing lines 36-42 as a mask.

The processing of FIGS. 12-22 splits programmable material of memory cells 80 between two portions corresponding to structures 60a and 60b. Such may advantageously increase structural integrity of pedestals comprising the programmable material, and may enable memory cells to have thicker programmable material than conventional constructions. The thicker programmable material may enable improved electrical separation between different memory states (e.g., "SET" and "RESET" memory states). Also, the thicker programmable material may enable utilization of faster materials, even if such materials have a lower switching field, due to improved separation of memory states achieved utilizing thicker materials.

The inclusion of separating material 34 between the programmable material portions 60a and 60b within memory cells 80 may be advantageous in tailoring electrical properties of the memory cells for particular applications. In other applications, it may be desired to omit the separating material, and to have the two portions 60a and 60b directly contacting one another. If the portions 60a and 60b directly contact one another, such portions may comprise different compositions relative to one another in some embodiments, and may comprise the same compositions as one another in other embodiments. For instance, both of the portions 60a and 60b may comprise chalcogenide; and in some embodiments the chalcogenide of portion 60a may be identical to that of portion 60b, while in other embodiments the chalcogenide of one portion may be different from that of the other.

The memory arrays described above with reference to FIGS. 11 and 22 may be considered to be examples of 3-D cross-point memory architecture in some embodiments.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "electrically insulative" may be both utilized to describe materials having insulative electrical properties. Both terms are considered synonymous in this disclosure. The utilization of the term "dielectric" in some instances, and the term "electrically insulative" in other instances, is to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional side views of the accompanying illustrations only show features within the planes of the cross-sections, and do not show materials behind the planes of the cross-sections in order to simplify the drawings. The cross-sectional plan views do show materials below the planes of the plan views.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a memory array comprising a first series of access/sense lines extending along a first direction; and a second series of access/sense lines over the first series of access/sense lines and extending along a second direction which is substantially orthogonal to the first direction. The memory array also comprises memory cells vertically between the first and second series of access/sense lines. Each memory cell is uniquely addressed by a combination of an access/sense line from the first series and an access/sense line from the second series. The memory cells comprise programmable material. At least some of the programmable material within each memory cell is a polygonal structure having a sidewall that extends along a third direction which is different from the first and second directions.

Some embodiments include a method of forming a memory array. First access/sense material is formed over a semiconductor substrate. The first access/sense material is patterned into first lines which extend along a first direction. The first lines comprise a first series of access/sense lines. Programmable material is formed over the first lines. The programmable material is patterned into diagonal lines that cross the first lines. The diagonal lines extend along a diagonal direction that is not parallel to the first direction and that is not orthogonal to the first direction. Second access/sense material is formed over the diagonal lines. The second access/sense material is patterned into second lines which extend along a second direction. The second direction is substantially orthogonal to the first direction. The second lines comprise a second series of access/sense lines. A pattern from the second lines is transferred into the programmable material to singulate the programmable material into individual memory cells. The programmable material within the memory cells has sidewalls which extend diagonally relative to sidewalls of the access/sense lines of the first and series. Each of the memory cells is uniquely addressed by a combination of an access/sense line from the first series and an access/sense line from the second series.

Some embodiments include a method of forming a memory array. A stack is formed over a semiconductor substrate. The stack comprises a first region of programmable material over a first access/sense material. The stack is patterned into first lines which extend along a first direction. The first lines comprise a first series of access/sense lines. A second region of programmable material is formed over the first lines. The second region of programmable material is patterned into diagonal lines that cross the first lines. The diagonal lines extend along a diagonal direction that is not parallel to the first direction and that is not orthogonal to the first direction. A pattern from the diagonal lines is transferred into the first region of the programmable material to singulate the first region of the programmable material into first programmable material portions of memory cells. The first programmable material portions are configured as first polygonal structures having a first peripheral shape; Second access/sense material is formed over the diagonal lines. The second access/sense material is patterned into second lines which extend along a second direction. The second direction is substantially orthogonal to the first direction. The second lines comprise a second series of access/sense lines. A pattern from the second lines is transferred into the second region of the programmable material to singulate the second region of the programmable material into second programmable material portions of the memory cells. The second programmable material portions are configured as second polygonal structures having a second peripheral shape different from the first peripheral shape. Each of the memory cells is uniquely addressed by a combination of an access/sense line from the first series and an access/sense line from the second series.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A memory array, comprising:
    a first series of access/sense lines extending along a first lateral direction relative to an upper surface of a substrate;
    a second series of access/sense lines elevationally, over the first series of access/sense lines and extending along a second lateral direction which is substantially orthogonal to the first lateral direction; and
    memory cells extending vertically upward relative to the upper surface and being disposed between the first and second series of access/sense lines; each memory cell being uniquely addressed by a combination of an access/sense line from the first series and an access/sense line from the second series; the memory cells comprising programmable material; at least some of the programmable material within each memory cell being a polygonal structure having a sidewall that extends along a third lateral direction which is different from the first and second lateral directions.

2. The memory array of claim 1 wherein the polygonal structure is substantially a parallelepiped.

3. The memory array of claim 2 wherein the sidewall is one of a pair of substantially identical longest sidewalls of the parallelepiped.

4. The memory array of claim 1 wherein the programmable material comprises phase change material.

5. The memory array of claim 1 wherein the programmable material comprises chalcogenide.

6. The memory array of claim 1 wherein all of the programmable material within each memory cell is configured as said polygonal structure.

7. The memory array of claim comprising select devices between the memory cells and the first access/sense lines; the select devices having sidewalls extending along the third lateral direction.

8. The memory array of claim 1 wherein the polygonal structure is a second polygonal structure, wherein only some of the programmable material within each memory cell is configured as said second polygonal structure, and wherein some of the programmable material within each memory cell is configured as a first polygonal structure beneath said second polygonal structure and having a different shape than the second polygonal structure.

9. The memory array of claim 8 wherein a portion of the programmable material configured as the first polygonal structure is a first portion of the programmable material of the memory cell; wherein a portion of the programmable material configured as the second polygonal structure is a second portion of the programmable material of the memory cell; and wherein each memory cell further comprises a separating material between the first and second portions.

10. The memory array of claim 9 further comprising select devices between the memory cells and the first access/sense lines; the select devices having sidewalls parallel to sidewalls of the first polygonal structures.

11. The memory array of claim 9 wherein the first and second portions are a same composition as one another.

12. The memory array of claim 9 wherein the first and second portions are different compositions relative to one another.

13. The memory array of claim 9 wherein the separating material comprises carbon.

14. The memory array of claim 8 wherein a portion of the programmable material configured as the first polygonal structure is a first portion of the programmable material of the memory cell; wherein a portion of the programmable material configured as the second polygonal structure is a second portion of the programmable material of a memory cell; and wherein the second portion is a different composition from the first portion.

15. The memory array of claim 14 wherein the first and second portions comprise chalcogenide.

* * * * *